(12) United States Patent
Kim et al.

(10) Patent No.: US 9,627,492 B2
(45) Date of Patent: Apr. 18, 2017

(54) SEMICONDUCTOR DEVICE

(71) Applicant: SAMSUNG ELECTRONICS CO., LTD., Suwon-si, Gyeonggi-do (KR)

(72) Inventors: Minhwan Kim, Hwaseong-si (KR); Jaehyun Jung, Suwon-si (KR); Jungkyung Kim, Seoul (KR); Kyuok Lee, Yongin-si (KR); Jaejune Jang, Hwaseong-si (KR); Changki Jeon, Gimpo-si (KR); Suyeon Cho, Seoul (KR); Seonghoon Ko, Hwaseong-si (KR); Kyu-Heon Cho, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/964,758

(22) Filed: Dec. 10, 2015

(65) Prior Publication Data

US 2016/0172486 A1 Jun. 16, 2016

(30) Foreign Application Priority Data

Dec. 12, 2014 (KR) ........................ 10-2014-0179564

(51) Int. Cl.
*H01L 29/66* (2006.01)
*H01L 29/40* (2006.01)
*H01L 29/423* (2006.01)
*H01L 29/78* (2006.01)
*H01L 29/06* (2006.01)

(52) U.S. Cl.
CPC ........ *H01L 29/402* (2013.01); *H01L 29/0653* (2013.01); *H01L 29/4238* (2013.01); *H01L 29/42368* (2013.01); *H01L 29/66689* (2013.01); *H01L 29/7816* (2013.01)

(58) Field of Classification Search
CPC ............... H01L 29/7823; H01L 29/063; H01L 29/0696; H01L 29/0882; H01L 29/1095; H01L 29/42356; H01L 29/0653; H01L 29/42368; H01L 29/4238; H01L 29/66689; H01L 29/7816
USPC ........................................................ 257/339
See application file for complete search history.

(56) References Cited

U.S. PATENT DOCUMENTS

| 5,777,366 | A | 7/1998 | Contiero et al. | |
|---|---|---|---|---|
| 8,754,469 | B2 * | 6/2014 | Pendharkar | H01L 29/0653 257/328 |
| 8,786,020 | B2 | 7/2014 | Smith | |
| 2010/0301411 | A1 * | 12/2010 | Takeda | H01L 29/0696 257/335 |

(Continued)

*Primary Examiner* — Tu-Tu Ho
(74) *Attorney, Agent, or Firm* — Lee & Morse P.C.

(57) ABSTRACT

A semiconductor device includes a semiconductor substrate having a first conductivity type, an epitaxial layer having a second conductivity type, an isolation area in the epitaxial layer to define an active area of the semiconductor substrate, a body area having a first conductivity type and a drift area having a second conductivity type adjacent to each other in the epitaxial layer, a LOCOS insulating layer in the drift area and surrounded by the drift area, a drain area adjacent to a side part of the LOCOS insulating layer and surrounded by the drift area, a body contact area and a source area in the body area and surrounded by the body area, and a gate area overlapping the drift area and a part of the LOCOS insulating layer from a direction of the body area.

17 Claims, 30 Drawing Sheets

(56) References Cited

U.S. PATENT DOCUMENTS

2012/0104492 A1  5/2012  Chu et al.
2012/0153211 A1  6/2012  Fork et al.
2013/0015523 A1  1/2013  You
2013/0341714 A1  12/2013  Jang et al.

* cited by examiner

SEMICONDUCTOR DEVICE

CROSS-REFERENCE TO RELATED APPLICATION

Korean Patent Application No. 10-2014-0179564, filed on Dec. 12, 2014, in the Korean Intellectual Property Office, and entitled: "Semiconductor Device," is incorporated by reference herein in its entirety.

BACKGROUND

1. Field

Embodiments relate to a semiconductor device including a lateral double-diffused metal-oxide-semiconductor (MOS) transistor.

2. Description of the Related Art

As semiconductor devices have high performance and multiple functions, utilization of high voltage integrated circuits, in which a plurality of high voltage transistors are disposed with low voltage circuits on a same chip, has been increased. In implementing the high voltage integrated circuits, lateral double-diffused metal-oxide-semiconductor (MOS) transistors have been widely used as power MOS transistors.

The lateral double-diffused MOS transistors require a low on-resistance characteristic and a high breakdown voltage characteristic. A reduced surface field (RESURF) technique is applied to the lateral double-diffused MOS transistors, and thus demands for the lateral double-diffused MOS transistor having the high breakdown voltage characteristic in addition to the low on-resistance characteristic have been increased.

SUMMARY

In accordance with an embodiment, a semiconductor device includes a semiconductor substrate having a first conductivity type, an epitaxial layer having a second conductivity type on the semiconductor substrate, an isolation area in the epitaxial layer to define an active area of the semiconductor substrate, a body area having a first conductivity type and a drift area having a second conductivity type, the body area and the drift area being adjacent to each other in the epitaxial layer, a local oxidation of silicon (LOCOS) insulating layer in the drift area, side and lower surfaces of the LOCOS insulating layer being surrounded by the drift area, a drain area adjacent to a side part of the LOCOS insulating layer, side and lower surfaces of the drain area being surrounded by the drift area, a body contact area and a source area in the body area, side and lower surfaces of the body contact area and the source area being surrounded by the body area, and a gate area overlapping the drift area and a part of the LOCOS insulating layer from a direction of the body area.

The gate area may include a plate gate part including a plate gate dielectric layer extending in a first direction of the active area and a plate gate conductive layer on the plate gate dielectric layer, and a finger gate part including a finger gate dielectric layer at a side surface of the plate gate part in a second direction perpendicular to the first direction of the active area, wherein the finger gate dielectric layer part has an area having a gate conductive layer and an area not having the gate conductive layer which are alternately disposed, and a finger gate conductive layer on the finger gate dielectric layer.

The finger gate part may include bar-shaped unit finger gate parts extending in the second direction of the active area.

The finger gate part may overlap the LOCOS insulating layer.

The finger gate conductive layer may include a conductive material having conductivity lower than the plate gate conductive layer.

The finger gate conductive layer may include an undoped conductive material.

The LOCOS insulating layer may include a LOCOS insulating layer in one body extending longer in the first direction of the active area than in the second direction of the active area.

The LOCOS insulating layer may have an independent island structure only under the unit finger gate part to overlap the unit finger gate part.

The gate area may include a plate gate dielectric layer part overlapping the drift area and a part of the LOCOS insulating layer from the direction of the body area, and a plate gate conductive layer part on the plate gate dielectric layer part.

A part of the plate gate conductive layer part, which overlaps the LOCOS insulating layer, may include an undoped conductive material.

In accordance with another embodiment, a semiconductor device includes a semiconductor substrate having a first conductivity type, an epitaxial layer having a second conductivity type on the semiconductor substrate, an isolation area in an epitaxial layer to define an active area of the semiconductor substrate, a body area having a first conductivity type and a drift area having a second conductivity type adjacent to each other in the epitaxial layer, a drain area in the drift area, side and lower surfaces of the drain area being surrounded by the drift area, a body contact area and a source area in the body area, side and lower surfaces of the body contact area and the source area being surrounded by the body area, and a gate area extending from the body area to the drift area, the gate area including a gate dielectric layer including a dielectric layer having different thicknesses in the body area and the drift area, and a gate conductive layer including a plate gate conductive layer part extending long in a first direction of the active area, and a finger gate conductive layer part extending in a second direction perpendicular to the first direction of the active area at a side part of the plate gate conductive layer part, wherein the finger gate conductive layer part has an area having the gate conductive layer and an area not having the gate conductive layer which are alternately disposed.

The gate dielectric layer may include a step gate dielectric layer in which a thickness of a dielectric layer in the drift area is greater than that of the dielectric layer in the body area.

The gate dielectric layer may include a plate gate dielectric layer part extending long in the first direction of the active area, and a finger gate dielectric layer part at a side part of the plate gate dielectric layer part extending in the second direction perpendicular to the first direction of the active area, wherein the finger gate dielectric layer part has an area having a gate dielectric layer and an area not having the gate dielectric layer which are alternately disposed.

The finger gate conductive layer part may include a conductive material with which impurities are not doped.

The gate dielectric layer may have an area greater than the gate conductive layer, the gate dielectric layer being partially exposed by an area not covered by the gate conductive layer.

In accordance with another embodiment, a semiconductor device includes a semiconductor substrate having a first conductivity type, an epitaxial layer having a second conductivity type on the semiconductor substrate, an isolation area in the epitaxial layer to define an active area of the semiconductor substrate, a body area having a first conductivity type and a drift area having a second conductivity type, the body area and the drift area being adjacent to each other in the epitaxial layer, a local oxidation of silicon (LOCOS) insulating layer in the drift area, side and lower surfaces of the LOCOS insulating layer being surrounded by the drift area, a drain area adjacent to the LOCOS insulating layer, side and lower surfaces of the drain area being surrounded by the drift area, a body contact area and a source area in the body area, side and lower surfaces of the body contact area and the source area being surrounded by the body area, and a gate on the epitaxial layer, the gate area only partially overlapping each of the drift area and the LOCOS insulating layer.

A portion of an upper surface of the LOCOS insulating layer may be exposed.

A portion of an upper surface of the drift area at least between the body area and the LOCOS insulating layer may be exposed.

The gate area may include a plurality of bar shaped portions on the epitaxial layer, the bar shaped portions extending in a first direction and being spaced apart from each other along a second direction perpendicular to the first direction to only partially overlap the drift area and the LOCOS insulating layer.

Only end portions of the bar shaped portions may overlap the LOCOS insulating layer.

In accordance with still another embodiment, a semiconductor device includes a semiconductor substrate having a first conductivity type, an epitaxial layer having a second conductivity type and formed on the semiconductor substrate, an isolation area which formed in the epitaxial layer and defines an active area of the semiconductor substrate, a body area and a drift area formed adjacent to each other in the epitaxial layer, wherein the body area is doped with first conductivity type impurities up to a first depth and the drift area is doped with second conductivity type impurities up to a second depth greater than the first depth, an LOCOS insulating layer formed in the drift area, wherein side and lower surfaces of the LOCOS insulating layer are surrounded by the drift area and the LOCOS insulating layer has a third depth smaller than the first depth, a drain area formed adjacent to a side part of the LOCOS insulating layer, wherein side and lower surfaces of the drain area are surrounded by the drift area, a body contact area and a source area, which are formed in the body area, wherein side and lower surfaces of the body contact area and the source area are surrounded by the body area, and a gate area which overlaps the drift area and a part of the LOCOS insulating layer from a direction of the body area. The gate area includes a finger gate dielectric layer including an area having a gate dielectric layer and an area not having the gate dielectric layer which are alternately disposed, and a finger gate conductive layer formed on the finger gate dielectric layer, wherein the finger gate conductive layer has an area having a gate conductive layer and an area not having the gate conductive layer which are alternately disposed.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
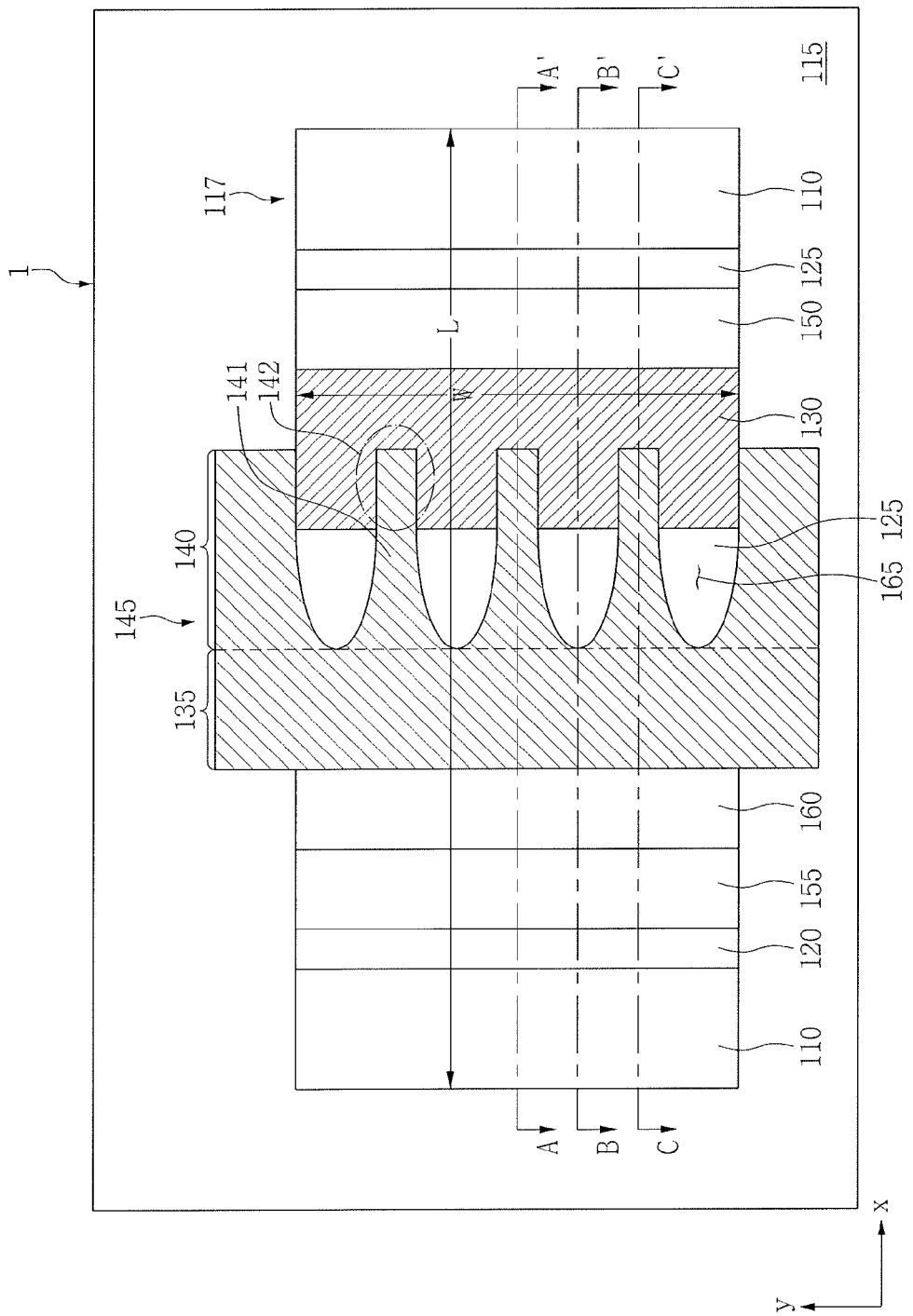
FIG. 1 illustrates a plan view of a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the embodiments but only to illustrate characteristic forms of regions of devices.

The dimensions of layers and regions in the drawings may be exaggerated for clarity of illustration. Further, it will be understood that when a layer or element is referred to as being "on" another layer or a substrate, the layer or element may be formed directly on the other layer or the substrate, or intervening layers or elements may also be present. In addition, it will also be understood that when a layer or element is referred to as being "between" two layers or elements, it can be the only layer or element between the two layers or elements, or one or more intervening layers or elements may also be present. The same reference numerals indicate the same components throughout the specification.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the embodiments.

Furthermore, throughout this disclosure, directional terms such as "upper," "intermediate," "lower." and the like may be used herein to describe the relationship of one element or feature with another, and the embodiments should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the embodiments.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
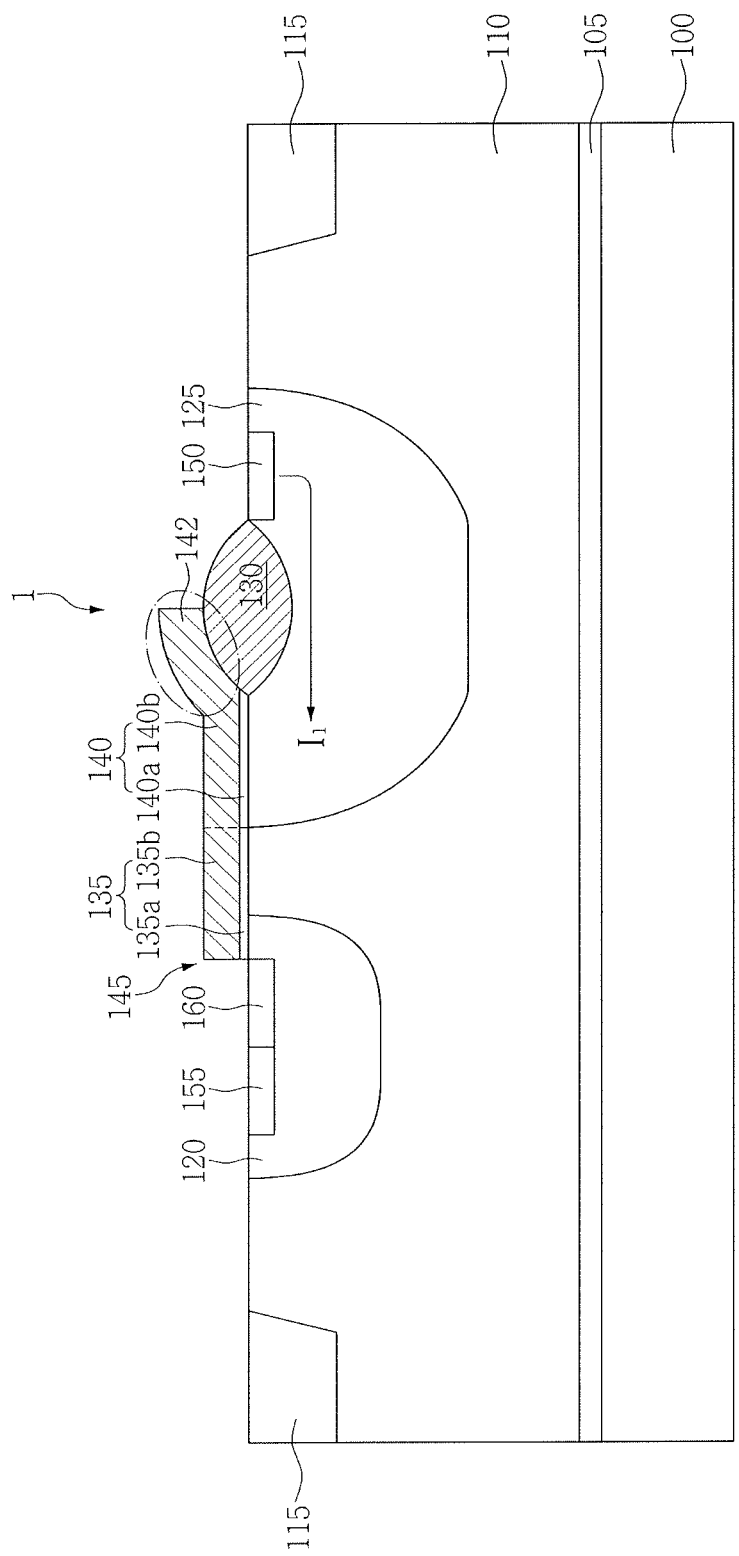
FIGS. 2 and 3 illustrate cross-sectional views of the semiconductor device in FIG. 1.
Figure 3:
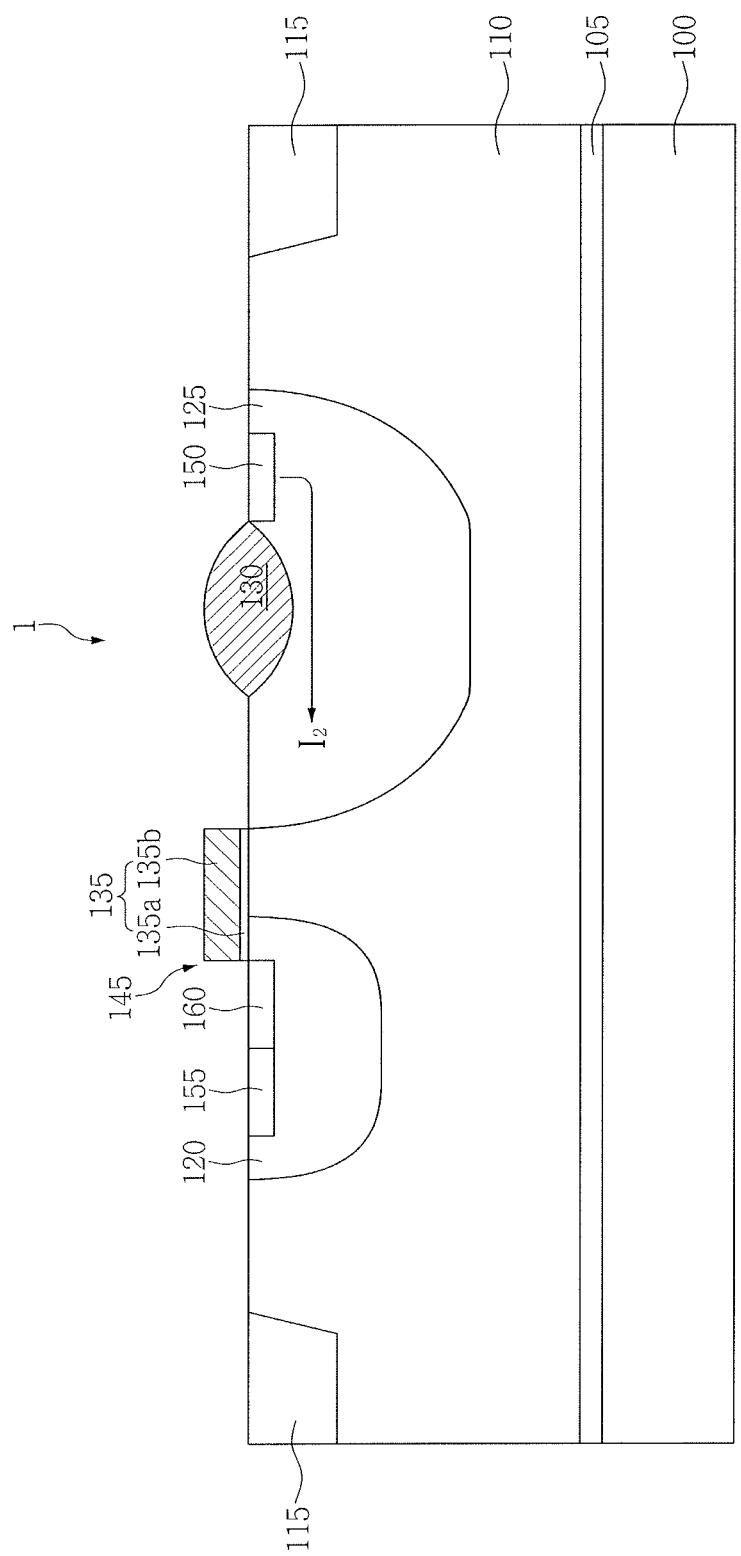
Figure 4:
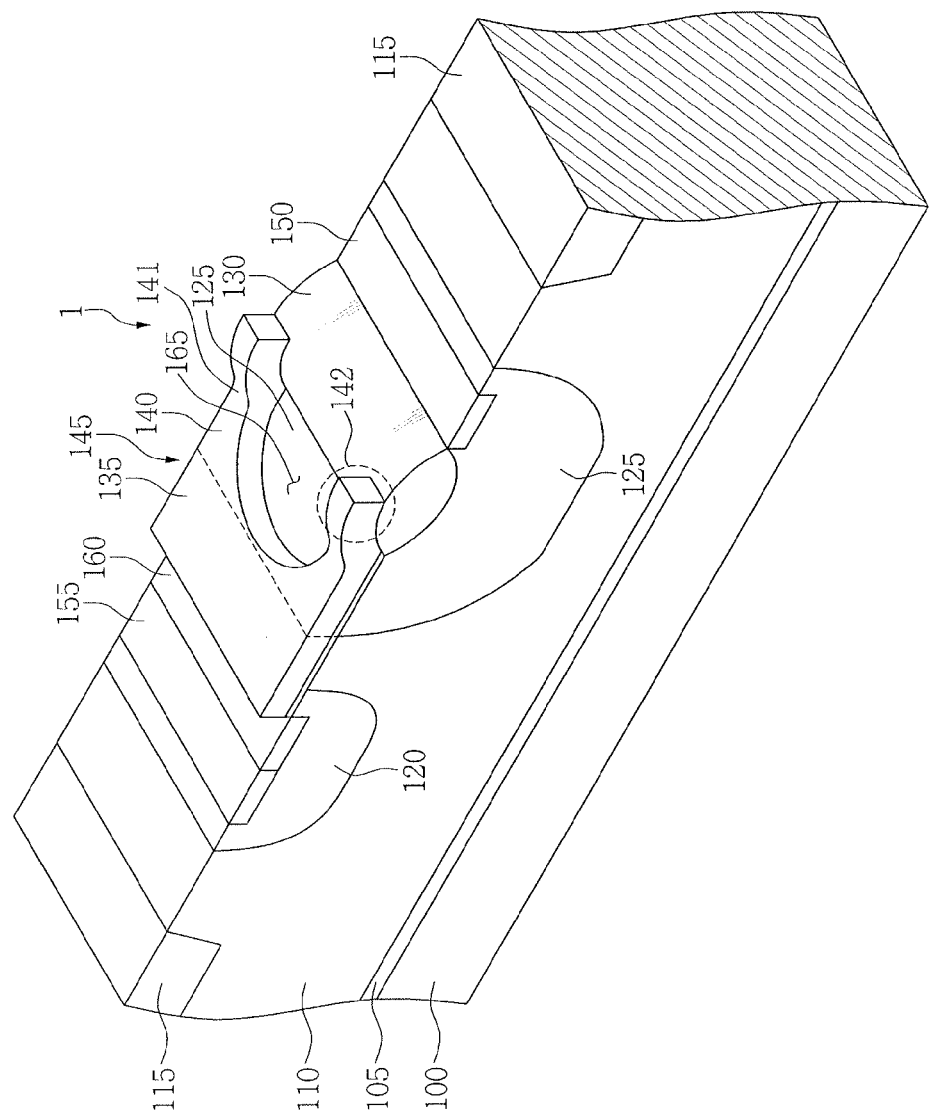
FIG. 4 illustrates a perspective view of the semiconductor device in FIG. 1.

FIG. 1 is a plan view showing a semiconductor device 1 in accordance with an embodiment. FIGS. 2 and 3 are cross-sectional views of the semiconductor device 1. FIG. 4 is a perspective view of the semiconductor device 1. FIG. 2 is a cross-sectional view along line A-A' of FIG. 1 and FIG. 3 is a cross-sectional view along line B-B' of FIG. 1. FIG. 4 is a perspective view showing a part between lines A-A' and C-C' of FIG. 1.

Referring to FIGS. 1 to 4, the semiconductor device 1 in accordance with the embodiment may include a semiconductor substrate 100, a buried layer 105, an epitaxial layer 110, an isolation area 115, a body area 120, a drift area 125, a local oxidation of silicon (LOCOS) insulating layer area 130, a gate area 145, a drain area 150, a body contact area 155, and a source area 160.

The semiconductor substrate 100 may include a first conductivity type semiconductor substrate.

The buried layer 105 may be formed on the semiconductor substrate 100. For example, the buried layer 105 may be formed on the semiconductor substrate 100 by implanting first conductivity type or second conductivity type impurities. In another example, the buried layer 105 may include an insulating layer formed through a deposition process or a thermally grown insulating layer.

The epitaxial layer 110 may be formed on the buried layer 105. The epitaxial layer 110 may be formed to be a second conductivity type. For example, the epitaxial layer 110 may be formed on the buried layer 105 through an epitaxial growth method. In another example the epitaxial layer 110 may be formed by implanting the second conductivity type impurities into the first conductivity type semiconductor substrate 100. An impurity doping concentration of the epitaxial layer 110 may be lower than an impurity doping concentration of the buried layer 105.

The isolation area 115 may be formed in an area of the epitaxial layer 110. The isolation area 115 may include a shallow trench isolation (STI) layer or a LOCOS isolation layer. An active area 117 may be defined on the semiconductor substrate 100 by the isolation area 115 to have a width W in a direction y and a length L in a direction x, as illustrated in FIG. 1.

The body area 120 and the drift area 125 may be formed in the active area 117 defined by the isolation area 115. The body area 120 and the drift area 125 may be formed by implanting impurities into a lower area from a surface of the epitaxial layer 110.

The body area 120 may be formed by implanting the first conductivity type impurities into a first area of the epitaxial layer 110. The body area 120 may be formed in the first area of the epitaxial layer 110 to have a first depth.

The drift area 125 may be formed by implanting the second conductivity type impurities into a second area of the epitaxial layer 110 different from the first area. The drift area 125 may be formed in the second area of the epitaxial layer 110 to have a second depth greater than the first depth. An impurity doping concentration of the drift area 125 may be higher than the impurity doping concentration of the epitaxial layer 110. The body area 120 and the drift area 125 may be formed so as to be spaced apart or to contact each other.

The LOCOS insulating layer 130 may be formed in the drift area 125. The LOCOS insulating layer 130 may include an insulating layer formed using a LOCOS method. Side and lower surfaces of the LOCOS insulating layer 130 may be surrounded by the drift area 125. The LOCOS insulating layer 130 may include a LOCOS insulating layer in one body, which is formed longer in the direction y than in the direction x within the active area 117 (FIG. 1).

The gate area 145 may include a plate gate part 135, which is formed longer in the direction y than in the direction x within the active area 117, and a finger gate part 140 having a shape of a plurality of bars formed in the direction x.

As illustrated in FIG. 2, the plate gate part 135 may include a plate gate dielectric layer part 135a and a plate gate conductive layer part 135b. The finger gate part 140 may include a finger gate dielectric layer part 140a ad a finger gate conductive layer part 140b.

The finger gate part 140 may include an area in which the finger gate dielectric layer part 140a and the finger gate conductive layer part 140b are present (FIG. 2) and an area in which the finger gate dielectric layer part 140a and the finger gate conductive layer part 140b are not present (FIG. 3), which are alternately disposed (FIG. 1). As illustrated in FIG. 4, the finger gate part 140 may include a plurality of unit finger gate parts 141. Further, an upper surface of the drift area 125 may be exposed under an area 165 not having the finger gate dielectric layer part 140a and the finger gate conductive layer part 140b.

The plate gate dielectric layer part 135a and the finger gate dielectric layer part 140a may each include, e.g., silicon oxide or a high-k dielectric. The plate gate conductive layer part 135b and the finger gate conductive layer part 140b may each include, e.g., polysilicon, a metal, or a metal silicide. The finger gate conductive layer part 140b may be formed of a conductive material having conductivity lower than the plate gate conductive layer part 135b. The finger gate conductive layer part 140b may be formed of an undoped conductive material.

As the finger gate part 140 is disposed by one side part of the plate gate part 135 in the direction x of the length L perpendicular to the direction y of the width W of the active area 117, the gate area 145 may have an overall comb structure, e.g., as viewed in plan top view of FIG. 1. The gate area 145 may be formed so as to overlap a part of an upper part of the LOCOS insulating layer 130 by crossing a part of the body area 120 and the drift area 125. The overlapping parts on the LOCOS insulating layer 130 may be end parts 142 of the finger gate part 140.

The drain area 150 may be formed in the drift area 125. The drain area 150 may be formed by implanting the second conductivity type impurities into the drift area 125. An impurity doping concentration of the drain area 150 may be higher than the impurity doping concentration of the drift area 125. The drain area 150 may be formed at one side part of the LOCOS insulating layer 130. The drain area 150 may be formed at the side part, which is not in contact with the gate area 145, among both side parts of the LOCOS insulating layer 130. The drain area 150 may be formed so as to contact the LOCOS insulating layer 130 without being spaced apart from the LOCOS insulating layer 130. Side surfaces and a lower surface of the drain area 150 may be surrounded by the drift area 125.

The body contact area 155 may be formed by implanting the first conductivity type impurities into the body area 120. An impurity doping concentration of the body contact area 155 may be higher than an impurity doping concentration of the body area 120.

The source area 160 may be formed by implanting the second conductivity type impurities into the body area 120. The source area 160 may be formed at one side part of the body contact area 155. The source area 160 may be formed at the side part, which is adjacent to the gate area 145, among both side parts of the body contact area 155. The body contact area 155 and the source area 160 may be formed so as to contact each other or to be spaced apart. Side surfaces and lower surfaces of the body contact area 155 and the source area 160 may be surrounded by the body area 120.

According to the semiconductor device 1 in accordance with the embodiment, the gate area 145 is formed to have the comb structure including the plate gate part 135 and the finger gate part 140. Thus, an area of the gate area 145 which overlaps the LOCOS insulating layer 130 is minimized due to the shape of the finger gate part 140, thereby reducing overlap capacitance. In detail, as overlap capacitance of the gate area 145 is proportional to the area of the gate area 145 which overlaps the LOCOS insulating layer 130, and as the finger gate part 140 of the gate area 145 has an open area, i.e., area without material of a gate dielectric layer and a gate conductive layer, indicated by reference numeral 165 of FIGS. 1 and 4, capacitance is reduced.

Further, since only the end parts 142 of the whole finger gate part 140 overlap the LOCOS insulating layer 130, the area of the gate area 145 which overlaps the LOCOS insulating layer 130 may be further minimized. Thus, the area of the gate area 145 which overlaps the LOCOS insulating layer 130 is minimized, and thus, the overlap capacitance generated in the gate area 145 may be reduced. When the finger gate part 140 which overlaps the LOCOS insulating layer 130 is formed of an undoped conductive material, the overlap capacitance of the gate area 145 may be further reduced.

Further, since a high electric field between the drain area 150 and the source area 160 is distributed into the drift area 125 due to the LOCOS insulating layer 130, a breakdown voltage may be prevented from reducing.

Further, when the LOCOS insulating layer 130 is formed in the drift area 125, the LOCOS insulating layer 130 is formed to have a shallow depth so as not to interrupt current flow between the drain area 150 and the source area 160. Referring to FIGS. 2 and 3, current flow paths $I_1$ and $I_2$ between the drain area 150 and the source area 160 are each formed under the LOCOS insulating layer 130. Thus, since the current flow paths $I_1$ and $I_2$ between the drain area 150 and the source area 160 are each formed along a gentle slope of the LOCOS insulating layer 130, an amount of on-resistance may be reduced.

Figure 5:
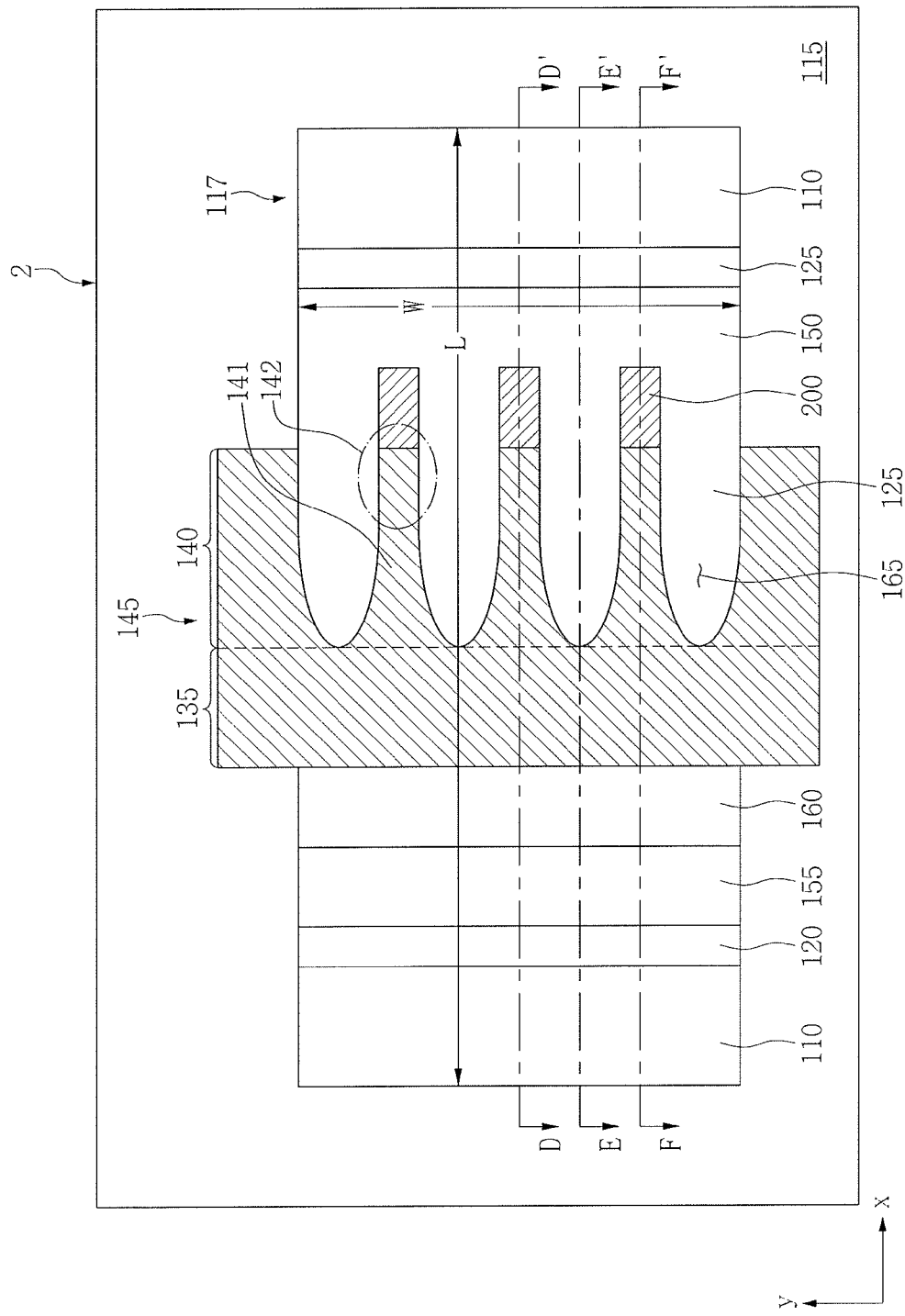
FIG. 5 illustrates a plan view of a semiconductor device in accordance with another embodiment.
Figure 6:
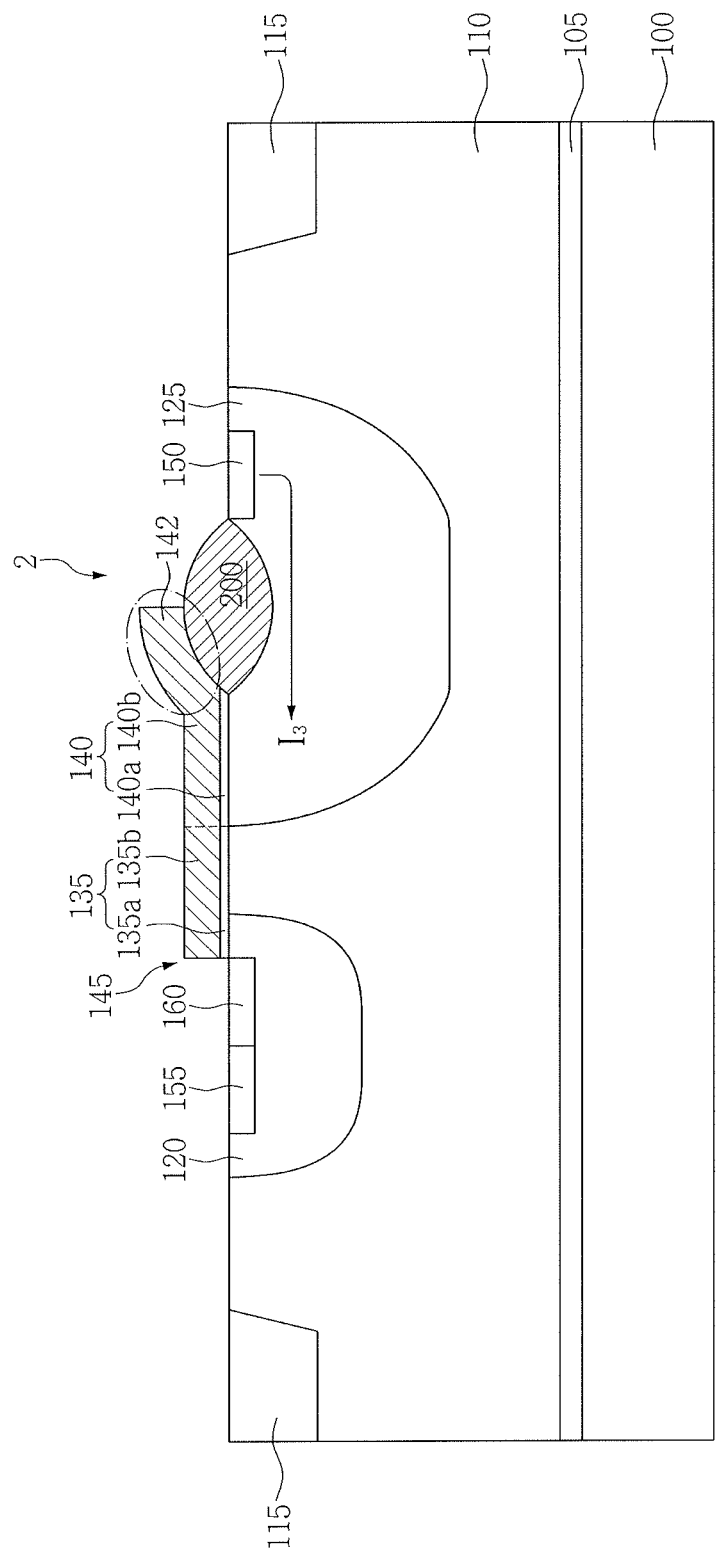
FIGS. 6 and 7 illustrate cross-sectional views of the semiconductor device in FIG. 5.
Figure 7:
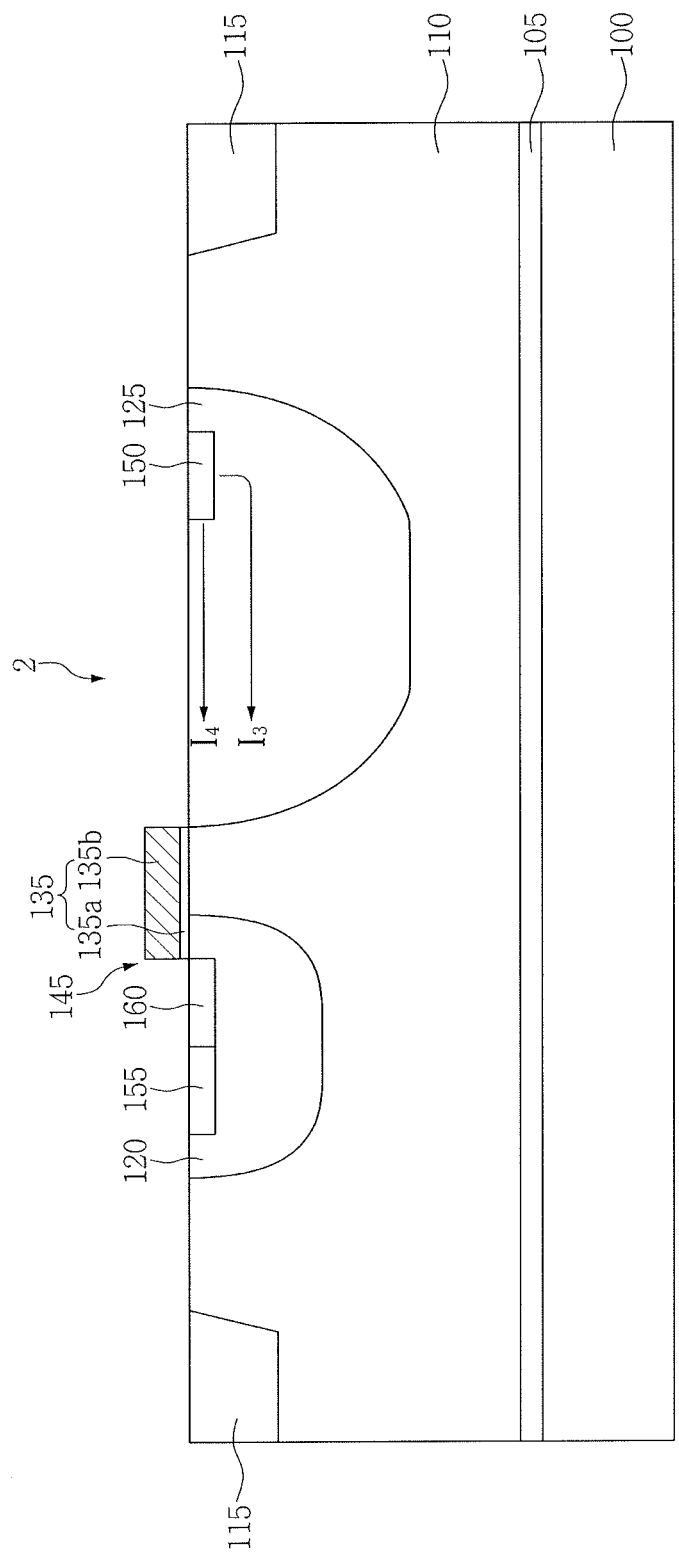
Figure 8:
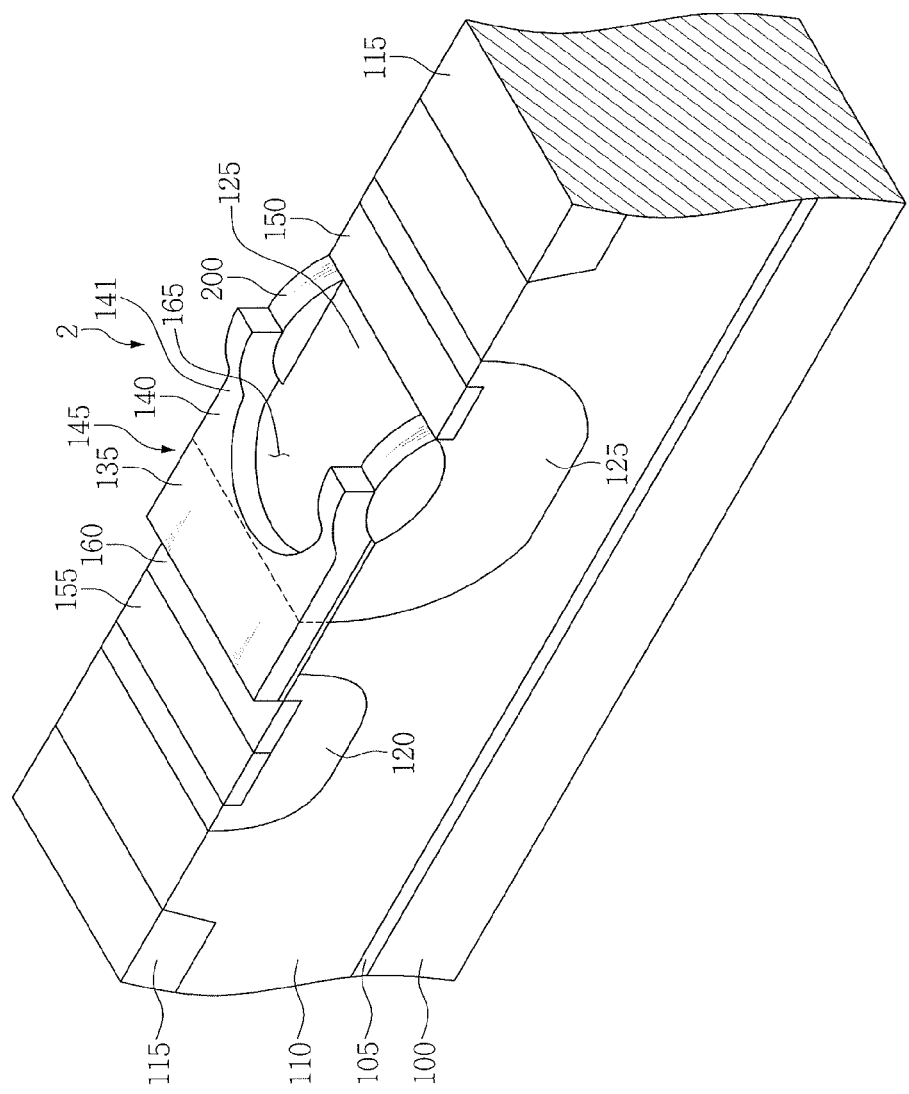
FIG. 8 illustrates a perspective view of the semiconductor device in FIG. 5.

FIG. 5 is a plan view showing a semiconductor device 2 in accordance with another embodiment. FIGS. 6 and 7 are cross-sectional views of the semiconductor device 2. FIG. 8 is a perspective view of the semiconductor device 2. FIG. 6 is a cross-sectional view showing an area taken along line D-D' of FIG. 5, and FIG. 7 is a cross-sectional view showing an area taken along line E-E' of FIG. 5. FIG. 8 is a perspective view showing areas taken along lines D-D' and F-F' of FIG. 5.

Referring to FIGS. 5 to 8, the semiconductor device 2 in accordance with the embodiment may include the semiconductor substrate 100, the buried layer 105, the epitaxial layer 110, the isolation area 115, the body area 120, the drift area 125, the gate area 145, the drain area 150, the body contact area 155, and the source area 160 in substantially the same structure as the semiconductor device 1 described in FIGS. 1 to 4. The semiconductor device 2 may further include a LOCOS insulating layer 200.

The LOCOS insulating layer 200 may be formed in the drift area 125. The LOCOS insulating layer 200 may include a LOCOS insulating layer with a structure having a plurality of islands which are formed in a line along the direction y. For example, as illustrated in FIGS. 5 and 8, the LOCOS insulating layer 200 may include a plurality of discrete and separate islands extending in the direction x and spaced apart from each other in the direction y. The LOCOS insulating layer 200 may include a LOCOS insulating layer with a structure having independent islands which are restrictively formed only under the overlapping unit finger gate part 141.

Side and lower surfaces of the LOCOS insulating layer 200 of the island structure may be surrounded by the drift area 125 (FIG. 6). The number of islands of the LOCOS insulating layer 200 which are overlapped by the finger gate part 140 may be determined according to the number of the finger gate parts 140. An end part 142 of the finger gate part 140 may overlap each of the islands of the LOCOS insulating layer 200.

An upper surface of the drift area 125 may be exposed in an area 165 not having a finger gate dielectric layer part 140a and a finger gate conductive layer part 140b and the adjacent LOCOS insulating layer 200 with the island structure.

According to the semiconductor device 2 in accordance with the embodiment, the gate area 145 is formed in a comb structure, and an area which overlaps the LOCOS insulating layer 200 of the island structure is minimized. Thus, an overlap capacitance of the gate area 145 may be reduced.

Referring further to FIG. 6, a current flow path $I_3$ between the drain area 150 and the source area 160 is formed under the LOCOS insulating layer 200 which has a gentle slope. Referring to FIG. 7, current flow paths $I_4$ and $I_5$ between the drain area 150 and the source area 160 are formed on a surface of the drift area 125 or in an inside area of the drift area 125. Thus, due to the LOCOS insulating layer 200, the number of the current flow paths between the drain area 150 and the source area 160 is increased, while a high breakdown voltage is maintained. Thus, an amount of on-resistance may be reduced.

Figure 9:
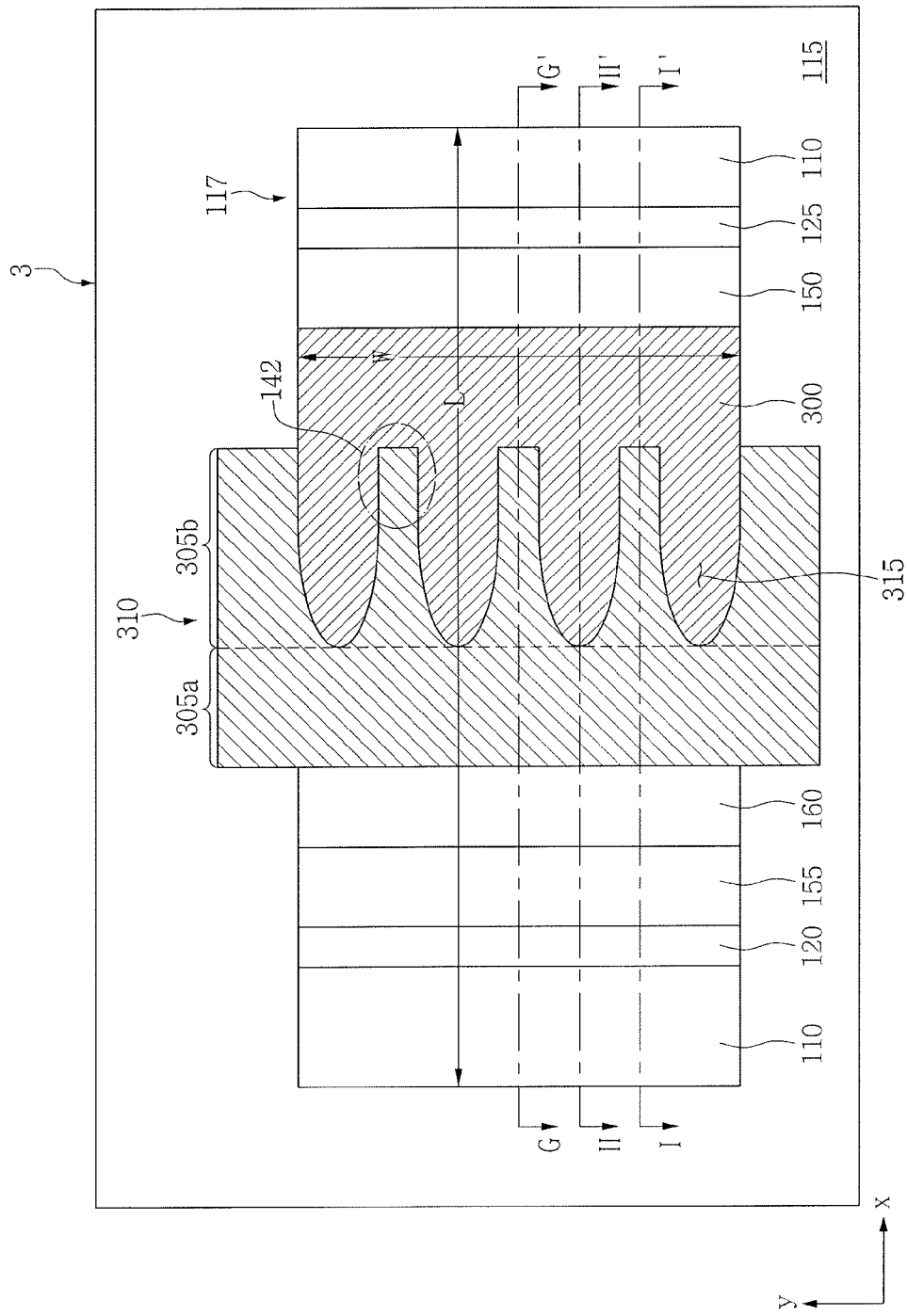
FIG. 9 illustrates a plan view of a semiconductor device in accordance with another embodiment.
Figure 10:
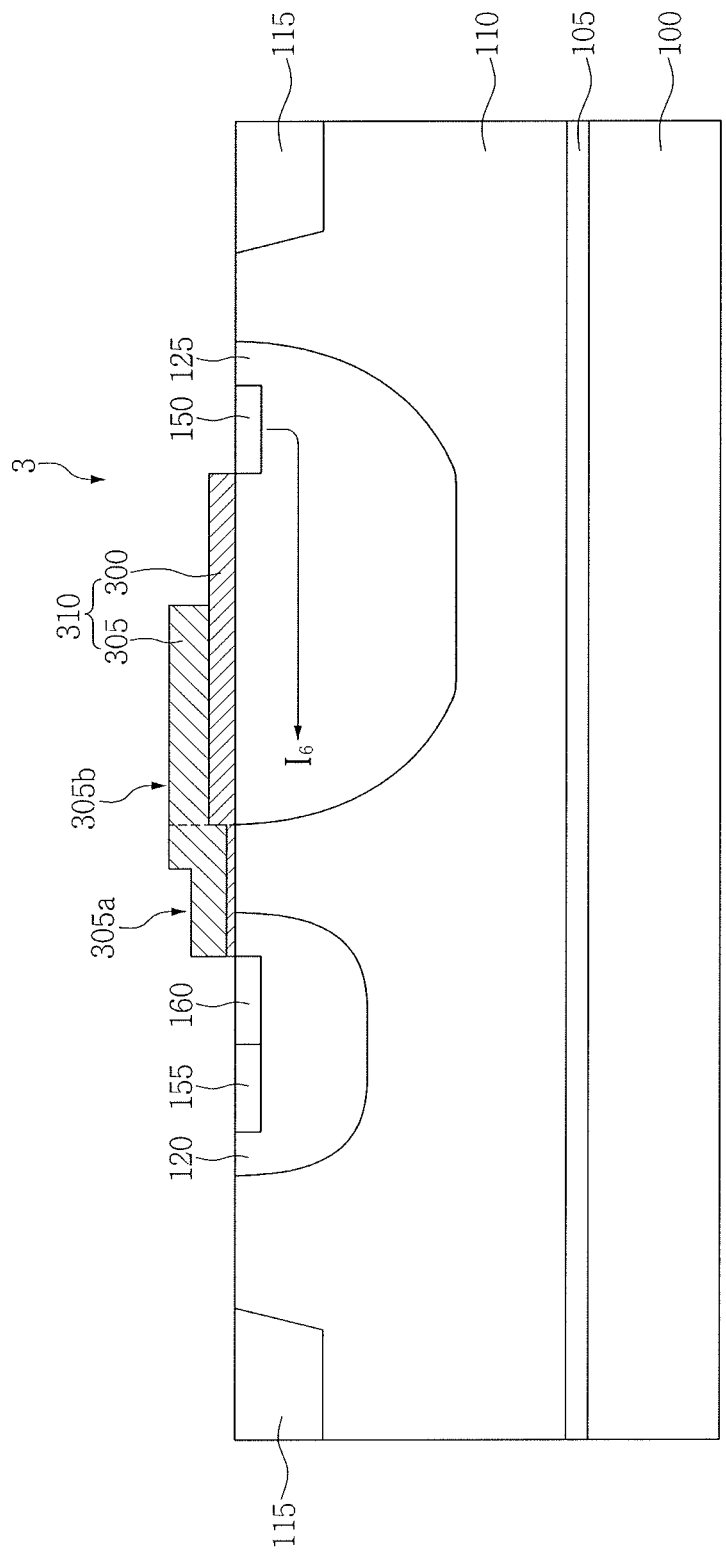
FIGS. 10 and 11 illustrate cross-sectional views of the semiconductor device in FIG. 9.
Figure 11:
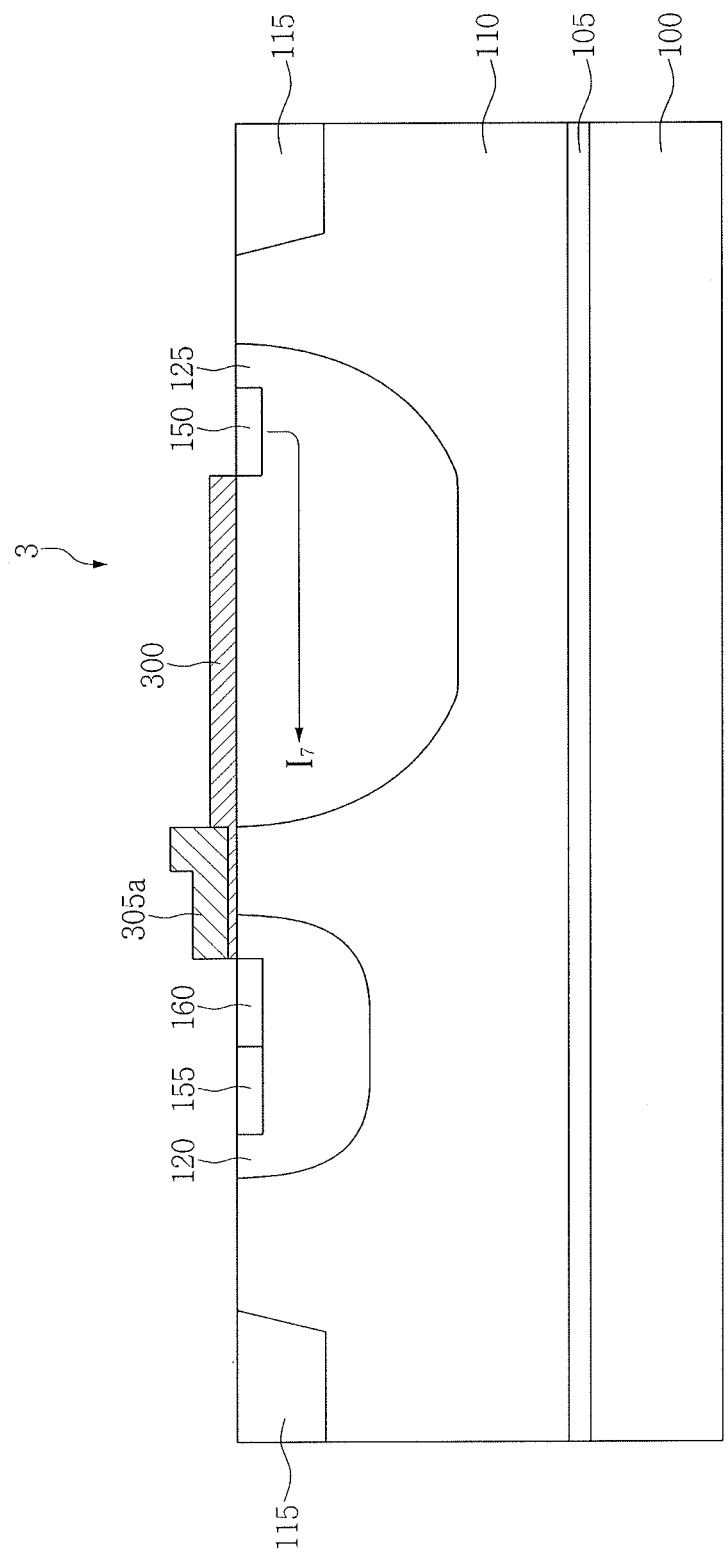
Figure 12:
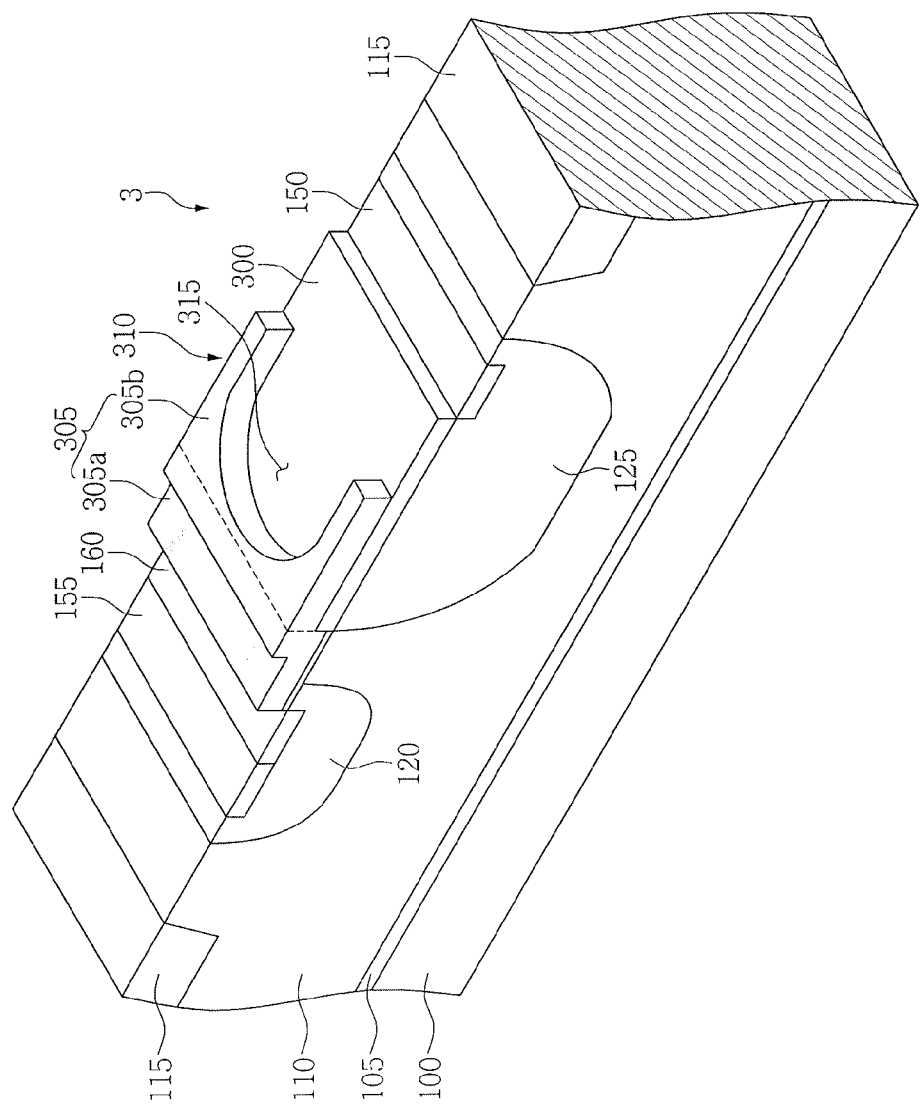
FIG. 12 illustrates a perspective view of the semiconductor device in FIG. 9.

FIG. 9 is a plan view showing a semiconductor device 3 in accordance with another embodiment. FIGS. 10 and 11 are cross-sectional views of the semiconductor device 3. FIG. 12 is a perspective view of the semiconductor device 3. FIG. 10 is a cross-sectional view showing an area taken along line G-G' shown in FIG. 9, and FIG. 11 is a cross-sectional view showing an area taken along line H-H' shown in FIG. 9. FIG. 12 is a perspective view showing areas taken along lines G-G' and I-I' shown in FIG. 9.

Referring to FIGS. 9 to 12, the semiconductor device 3 in accordance with the embodiment may include the semiconductor substrate 100, the buried layer 105, the epitaxial layer 110, the isolation area 115, the body area 120, the drift area 125, the drain area 150, the body contact area 155, and the source area 160 in substantially the same structure as that described in FIGS. 1 to 4. The semiconductor device 3 may further include a step gate area 310.

The step gate area 310 may include a step gate dielectric layer 300 and a step gate conductive layer 305.

The step gate dielectric layer 300 may include, e.g., silicon oxide or a high-k dielectric. The step gate dielectric layer 300 may be formed in the drift area 125 spaced apart from the body area 120. In the step gate dielectric layer 300, a thickness of the dielectric layer formed in the drift area 125 may be greater than a thickness of the dielectric layer formed in the body area 120.

The step gate conductive layer 305 may include a plate gate conductive layer part 305a, which is formed longer in the direction y than in the direction x, and a finger gate conductive layer part 305b formed at a side part of the plate gate conductive layer part 305a. The finger gate conductive layer part 305b may include a finger structure having a plurality of bars, in which an area having a gate conductive layer and an area not having the gate conductive layer are alternately disposed.

The step gate conductive layer 305 may include. e.g., polysilicon, a metal, or a metal silicide. The finger gate conductive layer part 305b is formed at a side part of the plate gate conductive layer part 305a in the direction of the length L perpendicular to the direction of the width W of the active area 117, and thus the step gate area 310 may have an overall comb structure. The finger gate conductive layer part 305b may be formed of a conductive material having conductivity lower than the plate gate conductive layer part 305a. The finger gate conductive layer part 305b may be formed of an undoped conductive material.

The step gate dielectric layer 300 may be formed to have an area greater than the step gate conductive layer 305. Thus, an area 315 may be exposed through an area not having the step gate conductive layer 305. Since the step gate conductive layer 305 is formed to have a structure combining a plate structure and a finger structure in comparison with the step gate dielectric layer 300 formed to have an overall plate structure, an upper surface of the step gate dielectric layer 300 may be exposed in the area 315 not having the step gate conductive layer 305.

According to the semiconductor device 3 in accordance with the embodiment, the step gate area 310 is formed to have a comb structure, and a contact area of the step gate dielectric layer 300 and the finger gate conductive layer part 305b, which are formed to extend to the drift area 125, is minimized. Thus, overlap capacitance of the step gate area 310 may be reduced. When the finger gate conductive layer part 305b is formed of an undoped conductive material, the overlap capacitance of the step gate area 310 may be further reduced.

Referring further to FIGS. 10 and 11, current flow paths $I_6$ and $I_7$ between the drain area 150 and the source area 160 are formed along a lower surface of the step gate dielectric layer 300. Thus, due to smooth current flow between the drain area 150 and the source area 160, an amount of on-resistance may be reduced.

Figure 13:
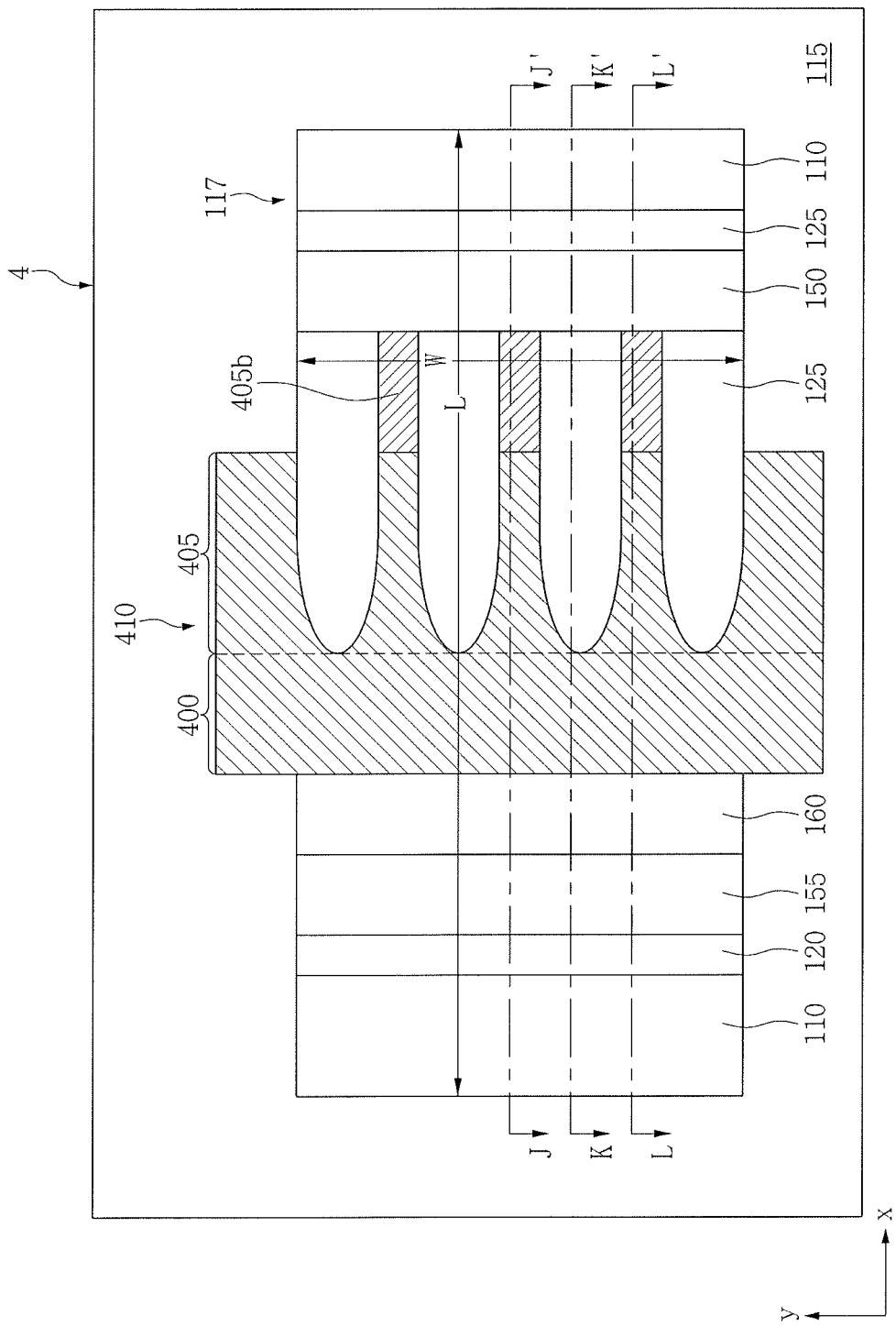
FIG. 13 illustrates a plan view of a semiconductor device in accordance with another embodiment.
Figure 14:
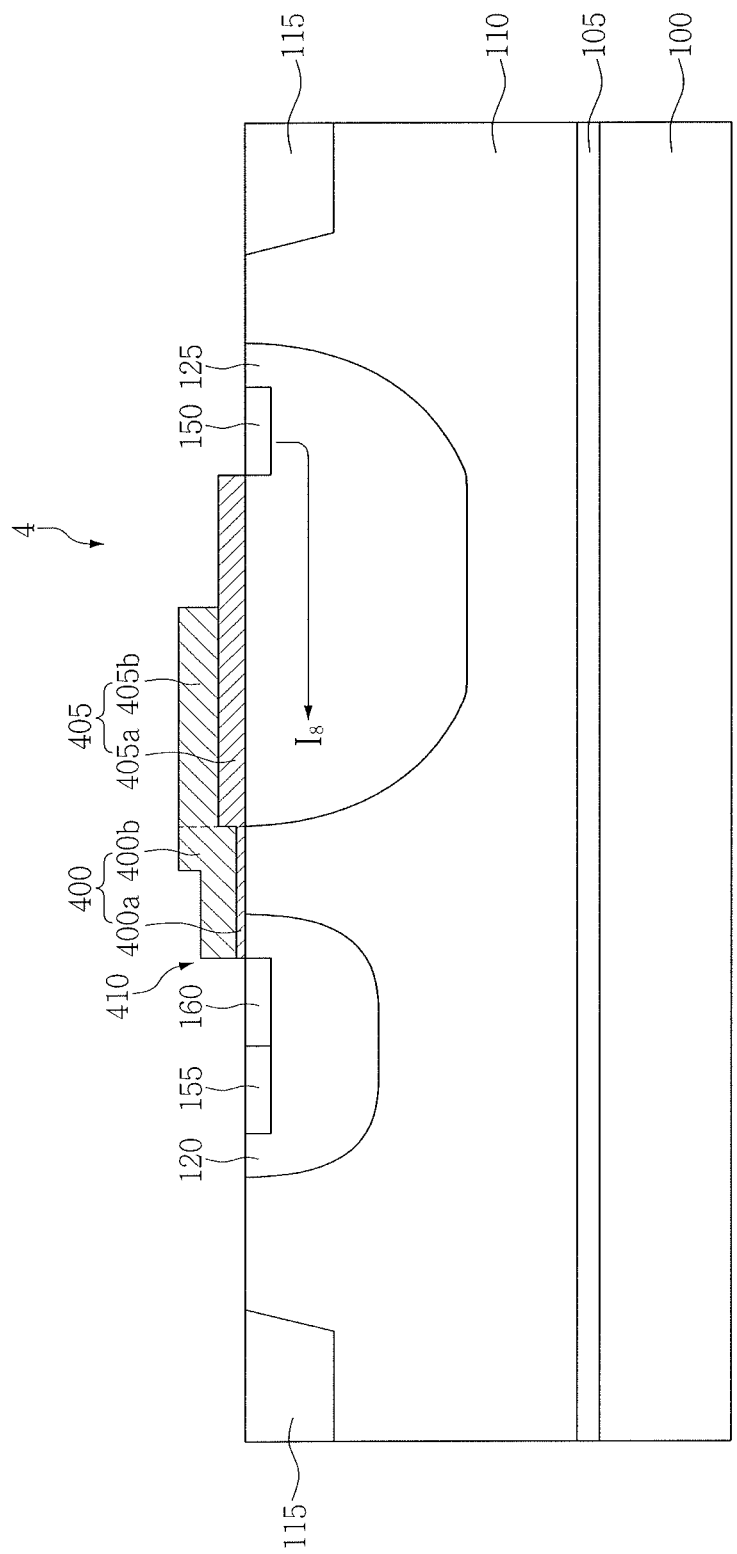
FIGS. 14 and 15 illustrate cross-sectional views of the semiconductor device in FIG. 13.
Figure 15:
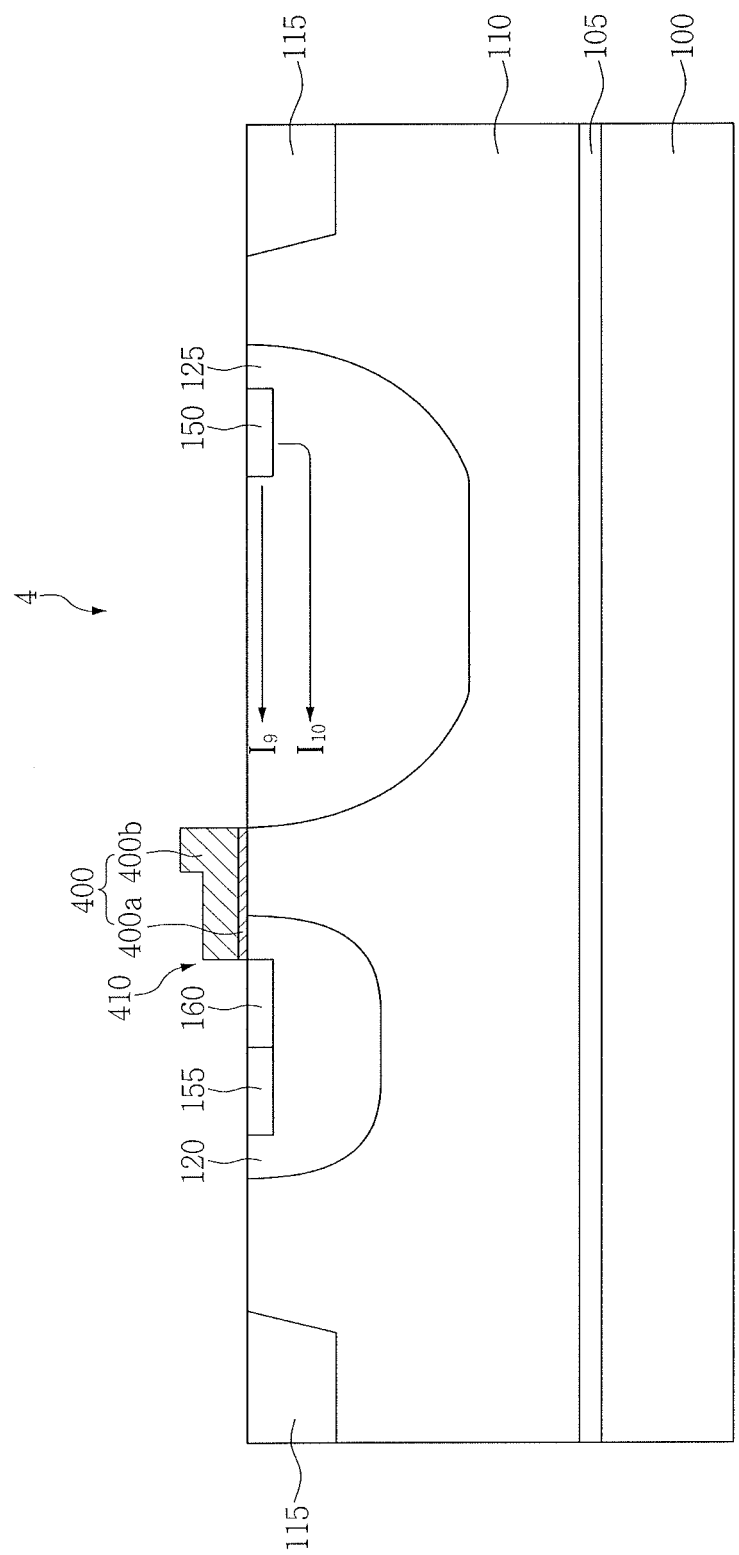
Figure 16:
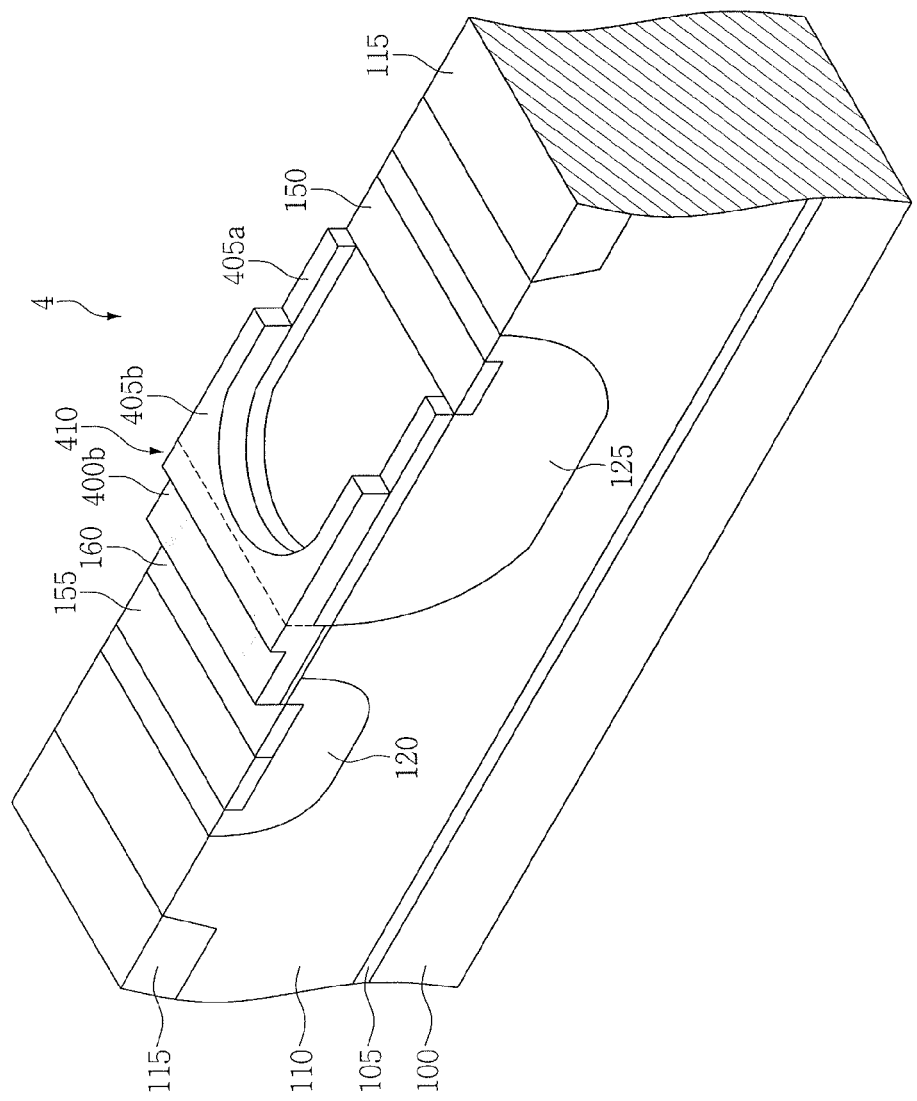
FIG. 16 illustrates a perspective view of the semiconductor device in FIG. 13.

FIG. 13 is a plan view showing a semiconductor device 4 in accordance with another embodiment. FIGS. 14 and 15 are cross-sectional views of the semiconductor device 4. FIG. 16 is a perspective view of the semiconductor device 4. FIG. 14 is a cross-sectional view showing an area taken along line J-J' shown in FIG. 13, and FIG. 15 is a cross-sectional view showing an area taken along line K-K' shown in FIG. 13. FIG. 16 is a perspective view showing areas taken along lines J-J' and L-L' shown in FIG. 13.

Referring to FIGS. 13 to 16, the semiconductor device 4 in accordance with the embodiment may include the semiconductor substrate 100, the buried layer 105, the epitaxial layer 110, the isolation area 115, the body area 120, the drift area 125, the drain area 150, the body contact area 155, and the source area 160 in substantially the same structure as that described in FIGS. 1 to 4. The semiconductor device 4 may further include a step gate area 410.

The gate area 410 may include a plate gate part 400 formed longer in the direction y than in the direction x, and a finger gate part 405 formed at a side part of the plate gate part 400.

The finger gate part 405 is formed at a side part of the plate gate part 400. Thus, the gate area 410 may have an overall comb structure.

The plate gate part 400 may include a plate gate dielectric layer part 400a and a plate gate conductive layer part 400b. The finger gate part 405 may include a finger gate dielectric layer part 405a and a finger gate conductive layer part 405b.

The finger gate dielectric layer part 405a may be formed to have a structure of a plurality of fingers in which an area having a gate dielectric layer and an area not having the gate dielectric layer are alternately disposed. The finger gate dielectric layer part 405a may be formed at a side part of the plate gate dielectric layer part 400a in the direction of the length L perpendicular to the direction of the width W of the active area 117.

The finger gate conductive layer part 405b may be formed to have a structure of a plurality of fingers in which an area having a gate conductive layer and an area not having the gate conductive layer are alternately disposed. The finger gate conductive layer part 405b may be formed at a side part of the plate gate conductive layer part 400b in the direction of the length L perpendicular to the direction of the width W of the active area 117. The finger gate conductive layer part 405b may be formed of a conductive material having conductivity lower than the plate gate conductive layer part 400b. The finger gate conductive layer part 405b may be formed of an undoped conductive material.

The finger gate dielectric layer part 405a may be formed in the drift area 125 to further extend in the direction x of the length L of the active area 117 compared to the finger gate conductive layer part 405b. Therefore, the finger gate dielectric layer part 405a may be exposed from an end part of the finger gate conductive layer part 405b.

According to the semiconductor device 4 in accordance with the embodiment, the step gate area 410 is formed to have a comb structure, and a contact area of the finger gate dielectric layer part 405a and the finger gate conductive layer part 405b, which are foamed to extend to the drift area 125, is minimized. Thus, overlap capacitance of the step gate area 410 may be reduced. When the finger gate conductive layer part 405b is formed of an undoped conductive material, the overlap capacitance of the step gate area 410 may be further reduced.

Referring further to FIG. 14, a current flow path $I_8$ between the drain area 150 and the source area 160 is formed along a lower area of the finger gate dielectric layer part 405a. Referring to FIG. 15, current flow paths $I_9$ and $I_{10}$ between the drain area 150 and the source area 160 are formed along a surface of the drift area 125 and an inside area of the drift area 125. Thus, due to smooth current flow between the drain area 150 and the source area 160, an amount of on-resistance may be reduced.

Figure 17:
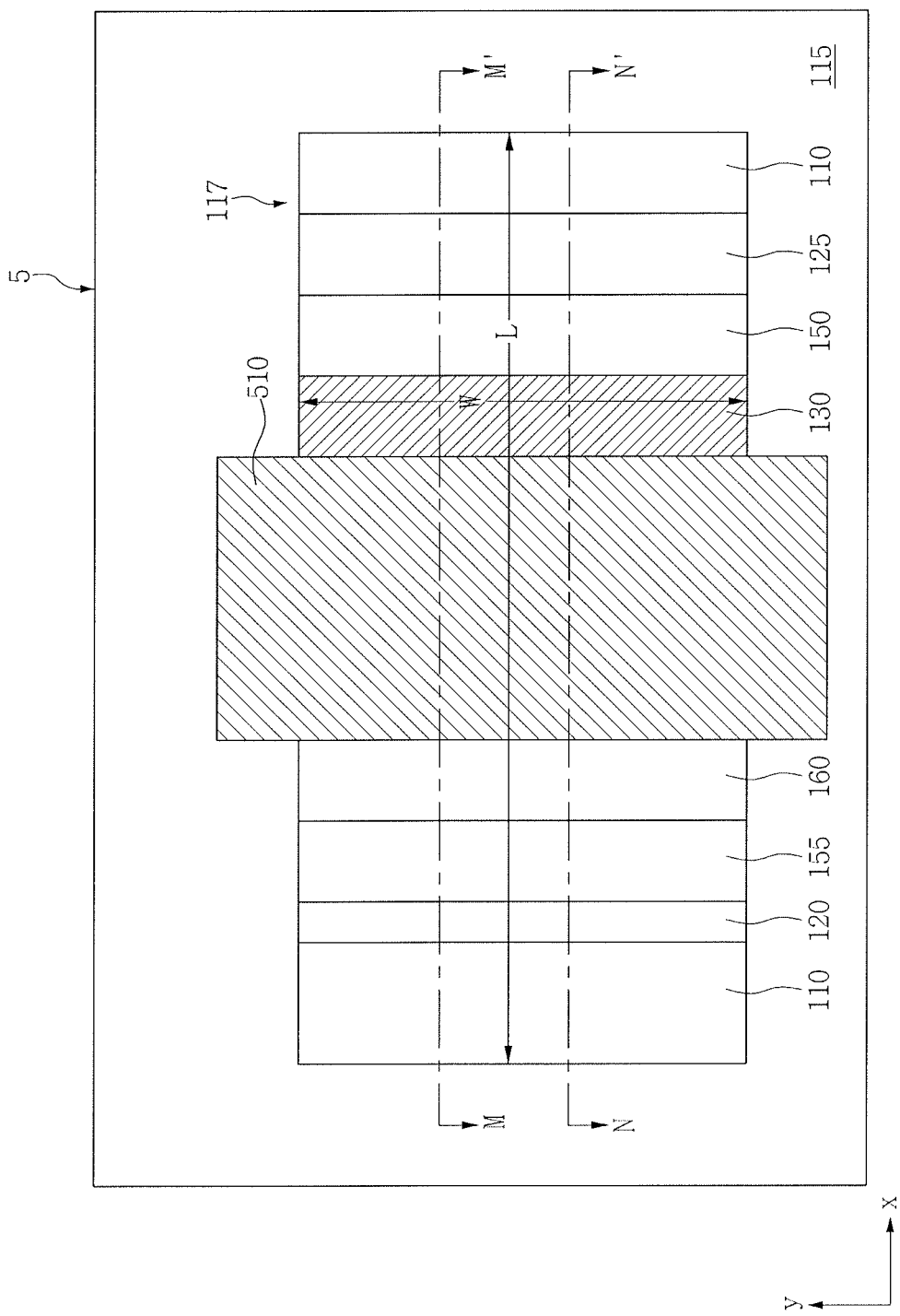
FIG. 17 illustrates a plan view of a semiconductor device in accordance with another embodiment.
Figure 18:
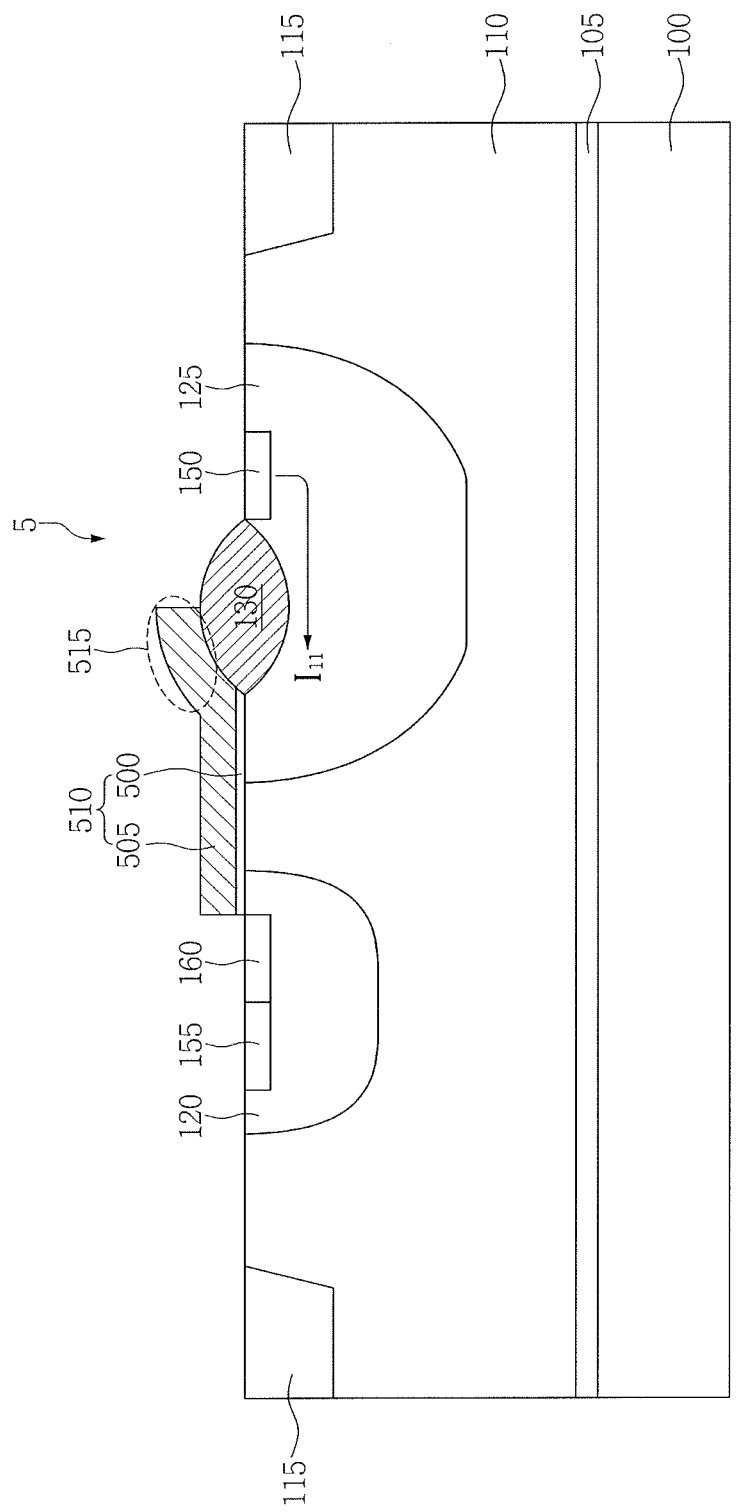
FIG. 18 illustrates a cross-sectional view of the semiconductor device in FIG. 17.
Figure 19:
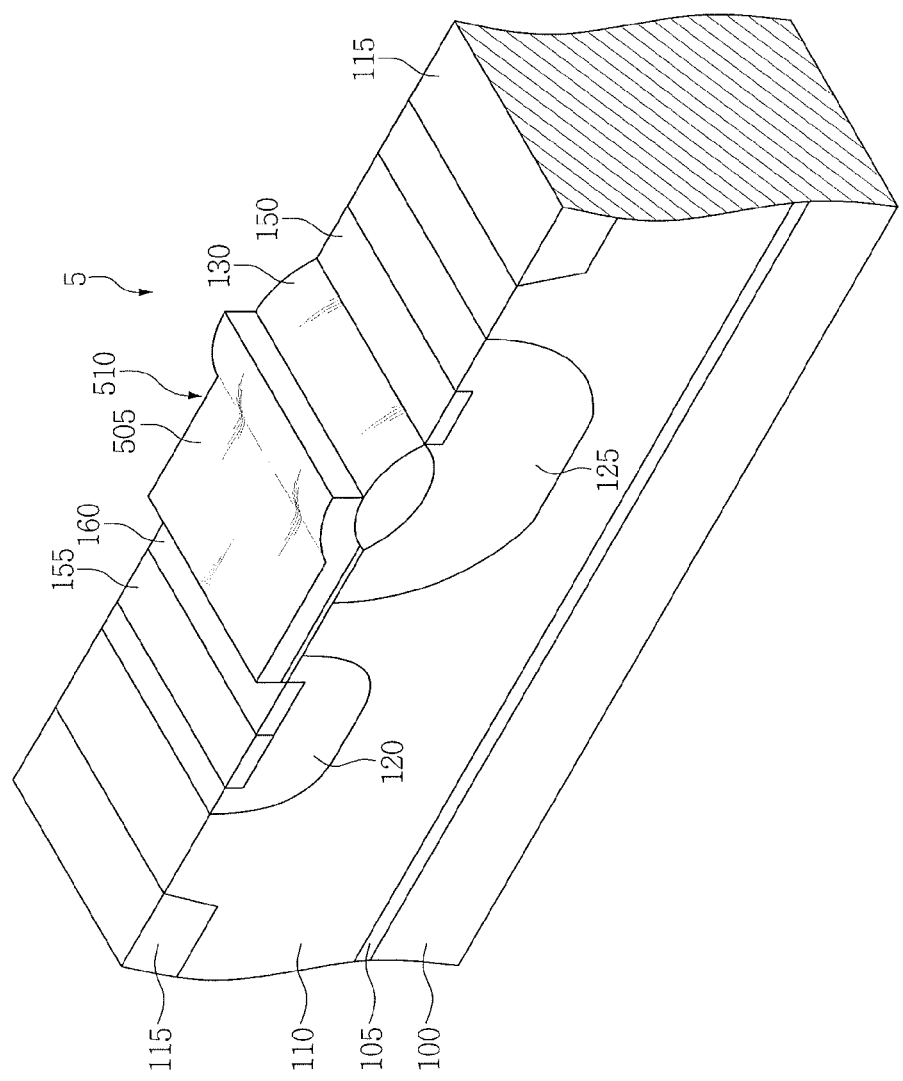
FIG. 19 illustrates a perspective view of the semiconductor device in FIG. 17.

FIG. 17 is a plan view showing a semiconductor device 5 in accordance with another embodiment. FIG. 18 is a cross-sectional view showing the semiconductor device 5. FIG. 19 is a perspective view showing the semiconductor device 5. FIG. 18 is a cross-sectional view showing an area taken along line M-M' in FIG. 17, and FIG. 19 is a perspective view showing areas taken along lines M-M' and N-N' in FIG. 17.

Referring to FIGS. 17 to 19, the semiconductor device 5 in accordance with the embodiment may include the semiconductor substrate 100, the buried layer 105, the epitaxial layer 110, the isolation area 115, the body area 120, the drift area 125, the LOCOS insulating layer area 130, the drain area 150, the body contact area 155, and the source area 160. The semiconductor device 5 may further include a plate gate area 510.

The plate gate area 510 may be formed so as to overlap a part of an upper part of the LOCOS insulating layer 130 by crossing a part of the body area 120 and the drift area 125. The plate gate area 510 may include a plate gate dielectric layer 500 and a plate gate conductive layer 505 formed on the plate gate dielectric layer 500. The plate gate dielectric layer 500 may include, e.g., silicon oxide or a high-k dielectric. The plate gate conductive layer 505 may include, e.g., polysilicon, a metal, or a metal silicide. An end part 515 of the gate conductive layer 505, which overlaps the LOCOS insulating layer 130, may be formed of a conductive material having conductivity lower than an area of the gate conductive layer which does not overlap the LOCOS insulating layer 130. The end part 515 of the gate conductive layer 505 may be formed of an undoped conductive material.

According to the semiconductor device 5 in accordance with the embodiment, the end part 515 of the plate gate conductive layer 505, which overlaps the LOCOS insulating layer 130, is formed of an undoped conductive material. Thus, overlap capacitance of the step gate area 510 may be reduced. Further, since a current flow path between the drain area 150 and the source area 160 is formed along a gentle slope of the LOCOS insulating layer 130, and a breakdown voltage may be prevented from decreasing due to the LOCOS insulating layer 130, an amount of on-resistance may be reduced.

Figure 20:
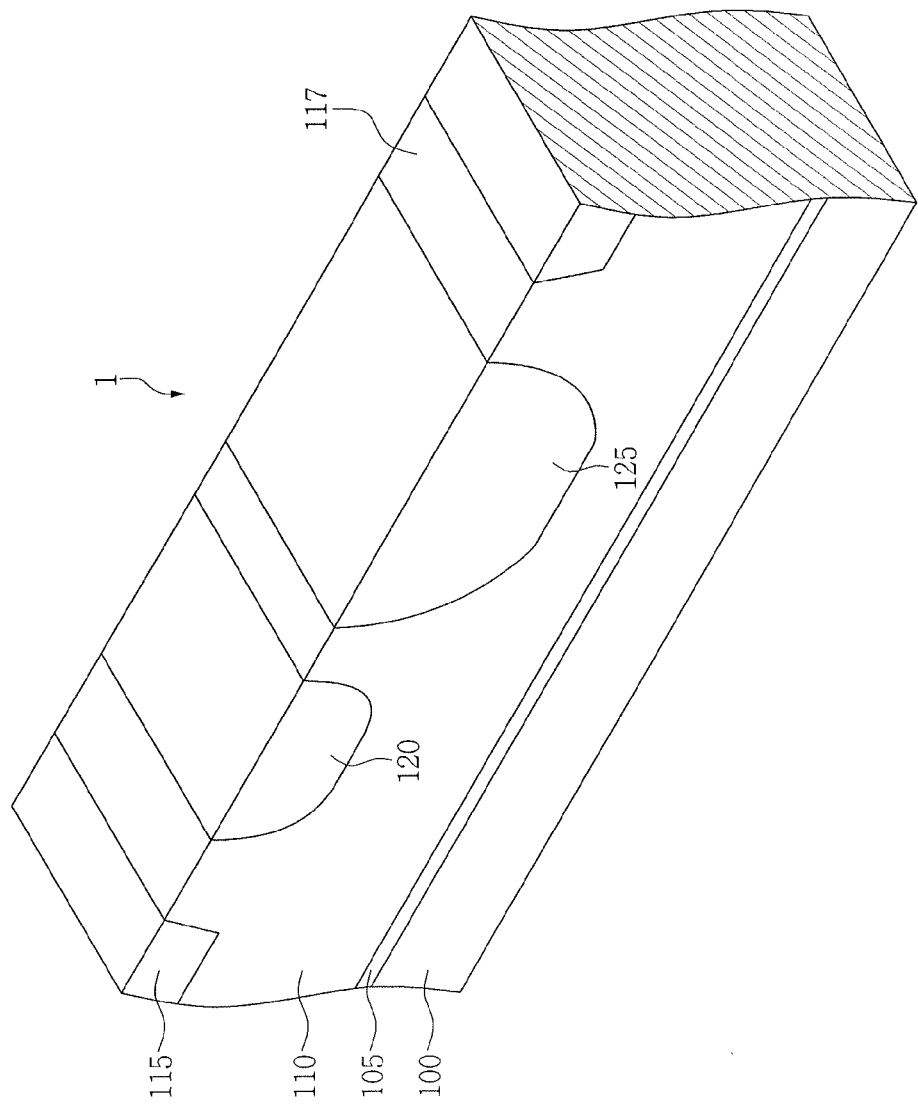
FIGS. 20 to 22 illustrate perspective views of stages in a method of manufacturing the semiconductor device in FIG. 1.
Figure 21:
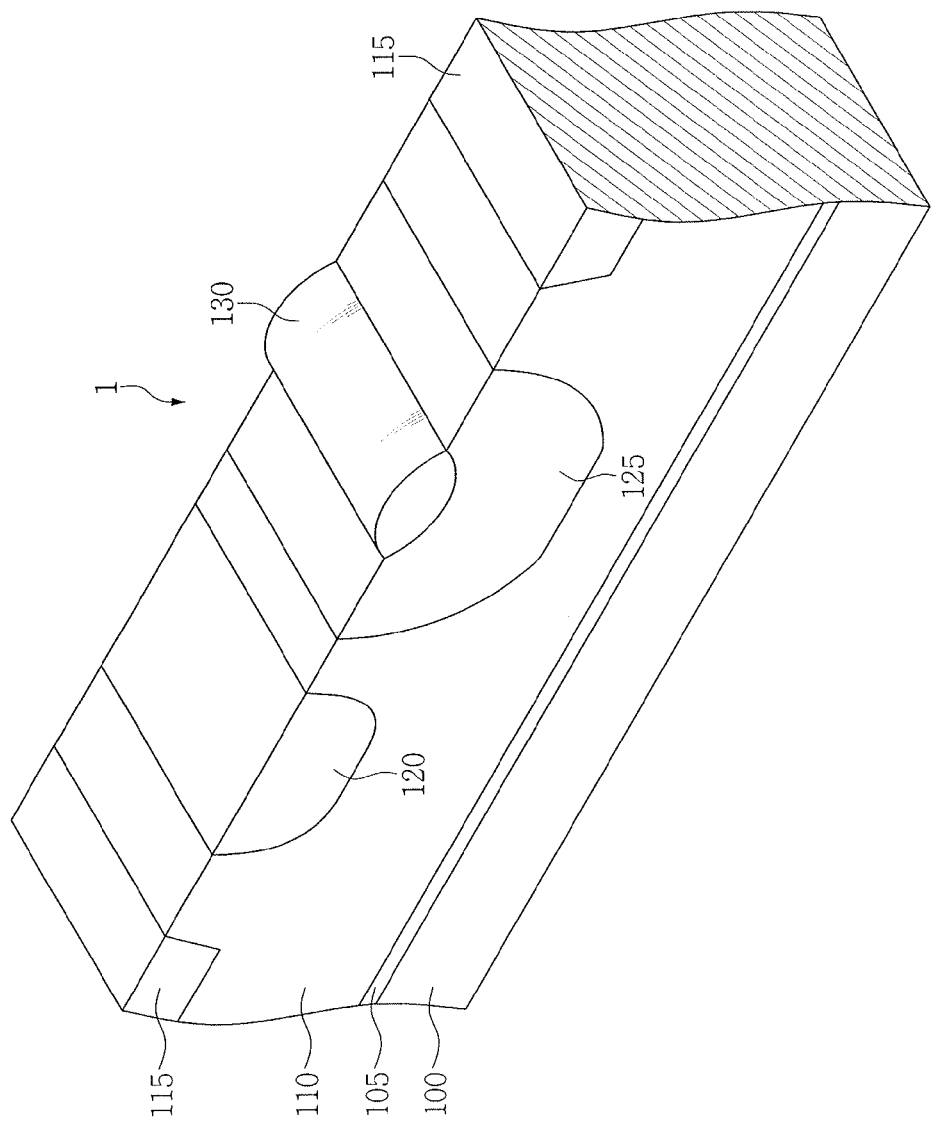
Figure 22:
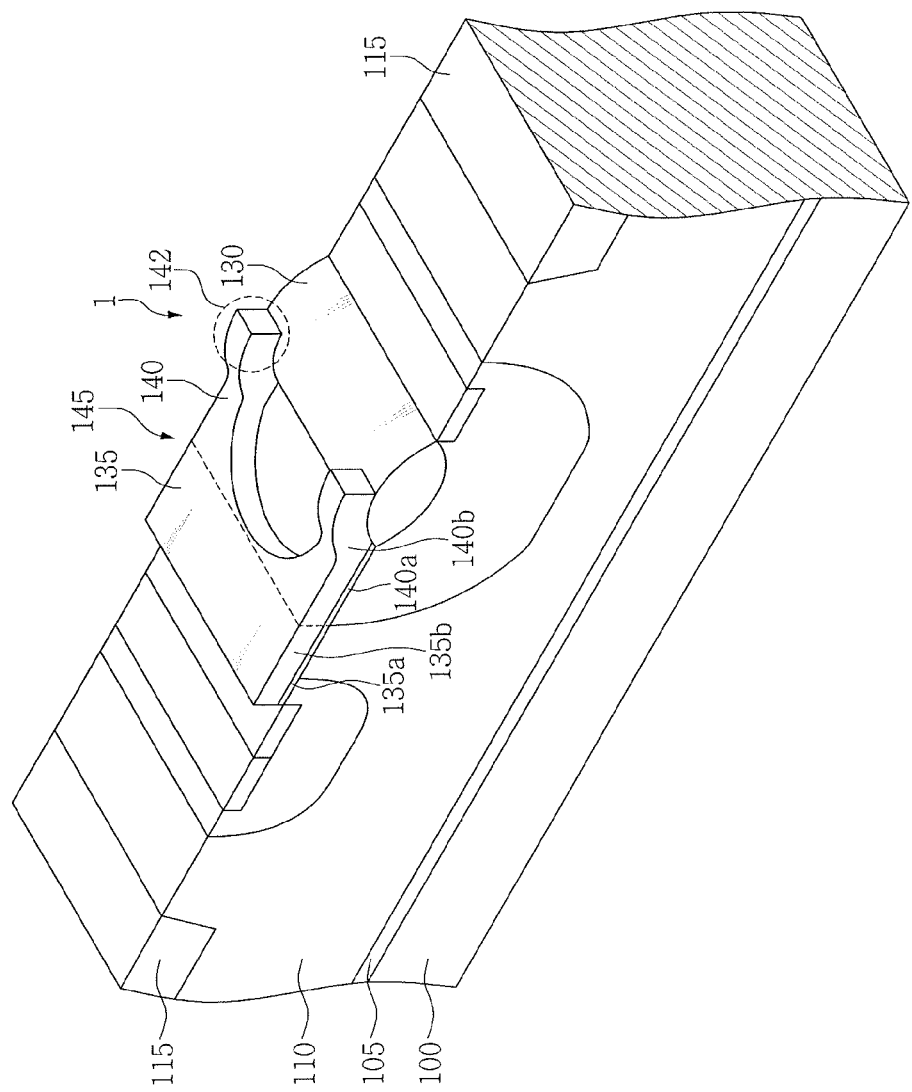

FIGS. 20 to 22 are perspective views for describing a method of manufacturing the semiconductor device 1 in accordance with the embodiment. FIGS. 20 to 22 are perspective views showing the areas taken along the lines A-A' and C-C' in FIG. 1.

Referring to FIG. 20, the method of manufacturing the semiconductor device 1 in accordance with the embodiment may include preparing a first conductivity type semiconductor substrate 100, forming the buried layer 105 and the epitaxial layer 110 on the semiconductor substrate 100, and forming the isolation area 115, the body area 120, and the drift area 125 on the epitaxial layer 110.

The semiconductor substrate 100 may be, e.g., a silicon substrate, a gallium arsenide substrate, a silicon germanium substrate, a ceramic substrate, a quartz substrate, a silicon on insulator (SOI) substrate, or a compound semiconductor substrate including at least two or more of Group 3, Group 4, and Group 5 elements in the periodic table of elements.

For example, forming the buried layer 105 may include implanting first conductivity type impurities or second conductivity type impurities in the semiconductor substrate 100. In another example, forming the buried layer 105 may include forming an insulating layer by a deposition process on the semiconductor substrate 100 or thermally growing an insulating layer on the semiconductor substrate 100.

For example, forming the epitaxial layer 110 may include forming an epitaxial layer on the buried layer 105 using an epitaxial growth method and implanting the second conductivity type impurities. In another example, forming the epitaxial layer 110 may include implanting the second conductivity type impurities into the first conductivity type semiconductor substrate 100. An impurity doping concentration of the epitaxial layer 110 may be lower than an impurity doping concentration of the buried layer 105.

Forming the isolation area 115 may include recessing an area of the epitaxial layer 110. The isolation area 115 may include a shallow trench isolation (STI) layer or a LOCOS isolation layer. An active area 117 may be defined on the semiconductor substrate 100 by the isolation area 115.

Forming the body area 120 may include implanting the first conductivity type impurities into the epitaxial layer 110 of the active area 117 defined by the isolation area 115. The body area 120 may be formed to have a first depth from an upper surface of the epitaxial layer 110.

Forming of the drift area 125 may include implanting the second conductivity type impurities into the epitaxial layer 110 of the active area 117 defined by the isolation area 115. The drift area 125 may be formed to have a second depth greater than the first depth from the upper surface of the epitaxial layer 110. An impurity doping concentration of the drift area 125 may be higher than the impurity doping concentration of the epitaxial layer 110. The body area 120 and the drift area 125 may be formed so as to be spaced apart or to contact each other.

Referring to FIG. 21, the method of manufacturing the semiconductor device 1 in accordance with the embodiment may include forming a LOCOS insulating layer 130 in the drift area 125.

The LOCOS insulating layer 130 may be formed to have a third depth smaller than the second depth of the body area 120. Side and lower surfaces of the LOCOS insulating layer 130 may be surrounded by the drift area 125. The LOCOS insulating layer 130 may be formed so as to have a shape formed longer in the direction y of the width W of the active area 117 than the direction x of the length L of the active area 117.

Referring to FIG. 22, the method of manufacturing the semiconductor device 1 in accordance with the embodiment may include forming the gate area 145 on the semiconductor substrate 100.

Forming of the gate area 145 may include sequentially forming a gate dielectric layer and a gate conductive layer on the epitaxial layer 110, in which the body area 120 and the drift area 125 are formed, and then performing a photolithography process.

The gate area 145 may be formed so as to include the plate gate part 135 formed long in the width W of the active area 117, and a finger gate part 140 having a shape of a plurality of bars.

The plate gate part 135 may be formed so as to include the plate gate dielectric layer part 135a and the plate gate conductive layer part 135b. The finger gate part 140 may be formed so as to include the finger gate dielectric layer part 140a and the finger gate conductive layer part 140b. The finger gate part 140 may be formed at a side part of the plate gate part 135 in the direction x of the length L perpendicular to the direction y of the width W of the active area 117. Thus, the gate area 145 may have an overall comb structure. The finger gate conductive layer part 140b of the finger gate part 140 may be formed of an undoped conductive material.

Forming the gate area 145 may include overlapping a part of an upper part of the LOCOS insulating layer 130 by crossing a part of the body area 120 and the drift area 125. The overlapping parts on the LOCOS insulating layer 130 may be end parts 142 of the finger gate part 140. Then, the method may include forming the drain area 150, the body contact area 155, and the source area 160 around the gate area 145 as shown in FIG. 4.

Forming the drain area 150 may include implanting the second conductivity type impurities into the drift area 125. An impurity doping concentration of the drain area 150 may be higher than the impurity doping concentration of the drift area 125. Forming the drain area 150 may include implanting the second conductivity type impurities on a side part of the LOCOS insulating layer 130, so the drain area 150 may be formed on a side part (a right side part in the drawing), which is farther away from the source area 160, among both side parts of the LOCOS insulating layer 130. Side and lower surfaces of the drain area 150 may be surrounded by the drift area 125. Forming the drain area 150 may include contacting the LOCOS insulating layer 130 without being spaced apart from the LOCOS insulating layer 130.

Forming the body contact area 155 may include implanting the first conductivity type impurities into the body area 120. An impurity doping concentration of the body contact area 155 may be higher than an impurity doping concentration of the body area 120.

Forming the source area 160 may include implanting the second conductivity type impurities into the body area 120. The source area 160 may be formed on a side part of the body contact area 120. The source area 160 may be formed on a side part (a right side part in the drawing), which is closer to the drift area 125, among both side parts of the body contact area 155. The body contact area 155 and the source area 160 may be formed so as to contact each other or to be spaced apart from each other. Side surfaces and lower surfaces of the body contact area 155 and the source area 160 may be surrounded by the body area 120. The drain area 150 and the source area 160 may be simultaneously formed through a second impurity implantation process.

Figure 23:
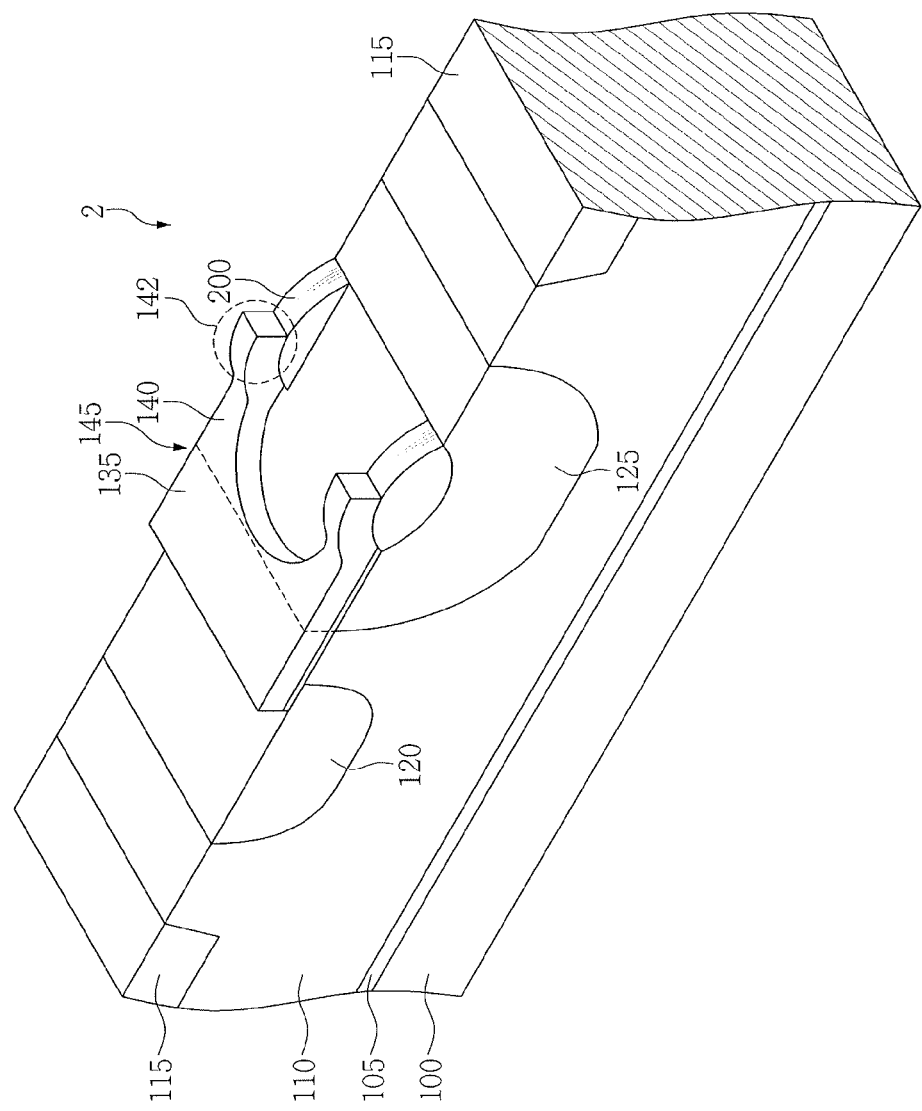
FIG. 23 illustrates a perspective view of a stage in a method of manufacturing the semiconductor device in FIG. 5.

FIG. 23 is a perspective view for describing a method of manufacturing the semiconductor device 2 in accordance with the embodiment. FIG. 23 is a perspective view showing the areas taken along the lines D-D' and F-F' shown in FIG. 5.

Referring to FIG. 23, the method of manufacturing the semiconductor device 2 in accordance with the embodiment may include forming the buried layer 105, the epitaxial layer 110, the isolation area 115, the body area 120, and the drift area 125 on the semiconductor substrate 100 in substantially the same manner as that described in FIG. 20, and further forming the LOCOS insulating layer 200 in the drift area 125.

Forming the LOCOS insulating layer 200 may include forming a LOCOS insulating layer with a structure having a plurality of islands, which are formed in a line along the direction y of a width W of the active area 117, in the drift area 125. Side and lower surfaces of the LOCOS insulating layer 200 of the island structure may be formed to be surrounded by the drift area 125. The LOCOS insulating layer 200 with the island structure may be formed so as to be independently overlapped by a plurality of finger gate parts 140. The number of islands of the LOCOS insulating layer 200 may be determined according to the number of the finger gate parts 140. End parts 142 of the finger gate part 140 may be formed on each island of the LOCOS insulating layer 200.

Then, the method may include forming the drain area 150, the body contact area 155, and the source area 160 around the gate area 145 as shown in FIG. 8.

Figure 24:
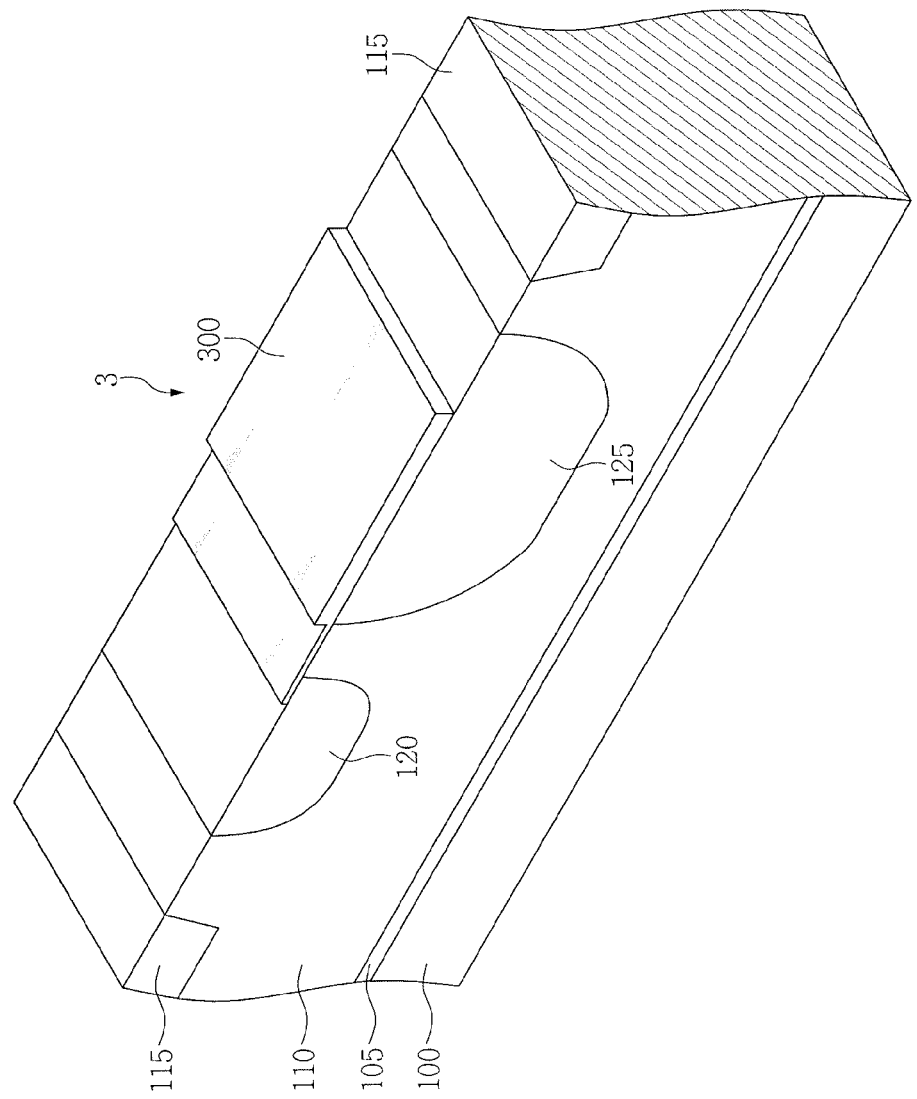
FIGS. 24 and 25 illustrate perspective views of stages in a method of manufacturing the semiconductor device in FIG. 9.
Figure 25:
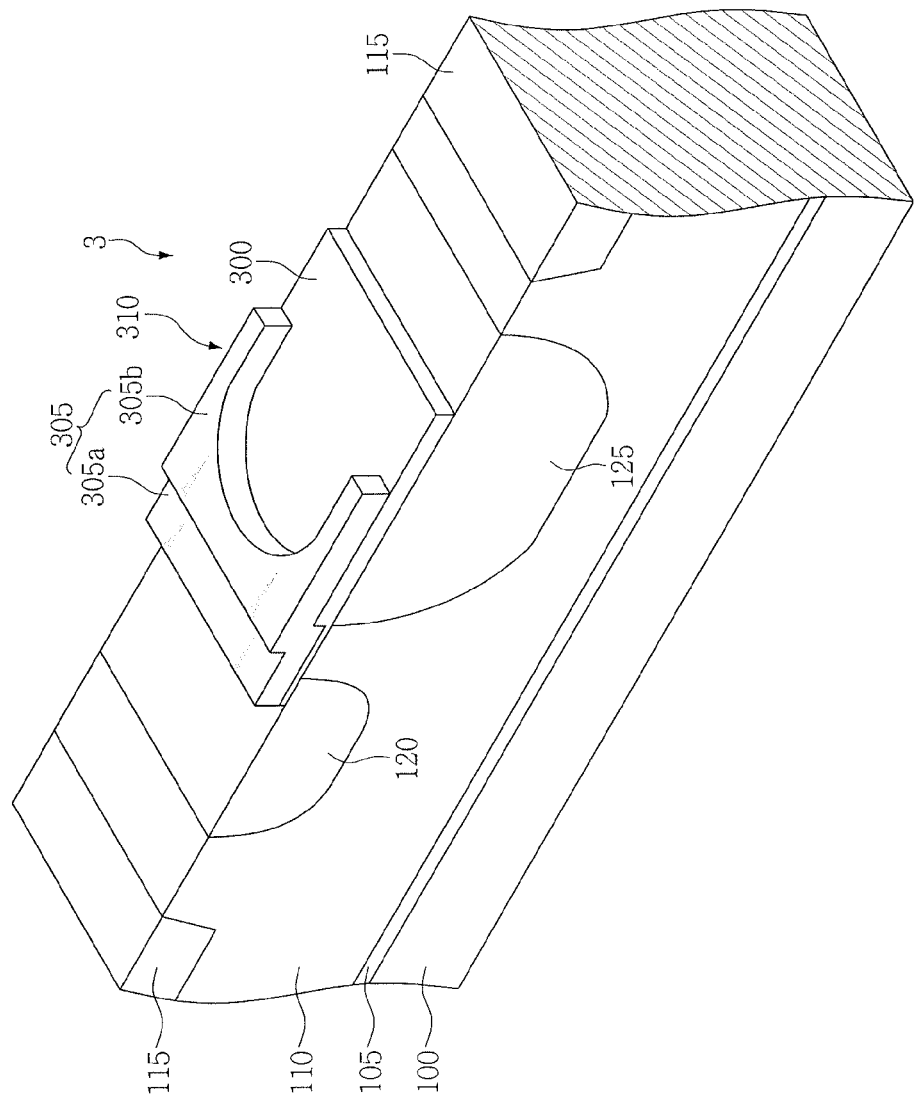

FIGS. 24 and 25 are perspective views for describing a method of manufacturing the semiconductor device 3 in accordance with the embodiment. FIGS. 24 and 25 are perspective views showing the areas taken along the lines G-G' and I-I' shown in FIG. 9.

Referring to FIG. 24, the method of manufacturing the semiconductor device 3 in accordance with the embodiment may include forming the buried layer 105, the epitaxial layer 110, the isolation area 115, the body area 120, and the drift area 125 in the semiconductor substrate 100 in substantially the same manner as that described in FIG. 20, and forming the step gate dielectric layer 300 on the semiconductor substrate 100.

Forming the step gate dielectric layer 300 may include forming a gate dielectric material on the epitaxial layer 110 in which the body area 120 and the drift area 125 are formed, and forming the step gate dielectric layer 300 which crosses from the body area 120 to the drift area 125 by etching the gate dielectric material. The step gate dielectric layer 300 may include, e.g., silicon oxide or a high-k dielectric.

Referring to FIG. 25, the method of manufacturing the semiconductor device 3 in accordance with the embodiment may include forming the step gate conductive layer 305 on the step gate dielectric layer 300 to form the step gate area 310. The step gate conductive layer 305 may include, e.g., polysilicon, a metal or a metal silicide.

The step gate conductive layer 305 may include the plate gate conductive layer part 305a formed long in the direction y of the width W of the active area 117 and the finger gate conductive layer part 305b having a shape of a plurality of bars. The finger gate conductive layer part 305b is formed at a side part of the plate gate conductive layer part 305a, and thus, the step gate conductive layer 305 may have an overall comb structure. The finger gate conductive layer part 305b may be formed of an undoped conductive material.

Then, the method may include forming the drain area 150, the body contact area 155, and the source area 160 around the step gate area 310 as shown in FIG. 12. The drain area 150 may be formed in the drift area 125, and the body contact area 155 and the source area 160 may be formed in the body area 120. The drain area 150 may be formed so as to contact an end part of the step gate dielectric layer 300 formed in the drift area 125.

Figure 26:
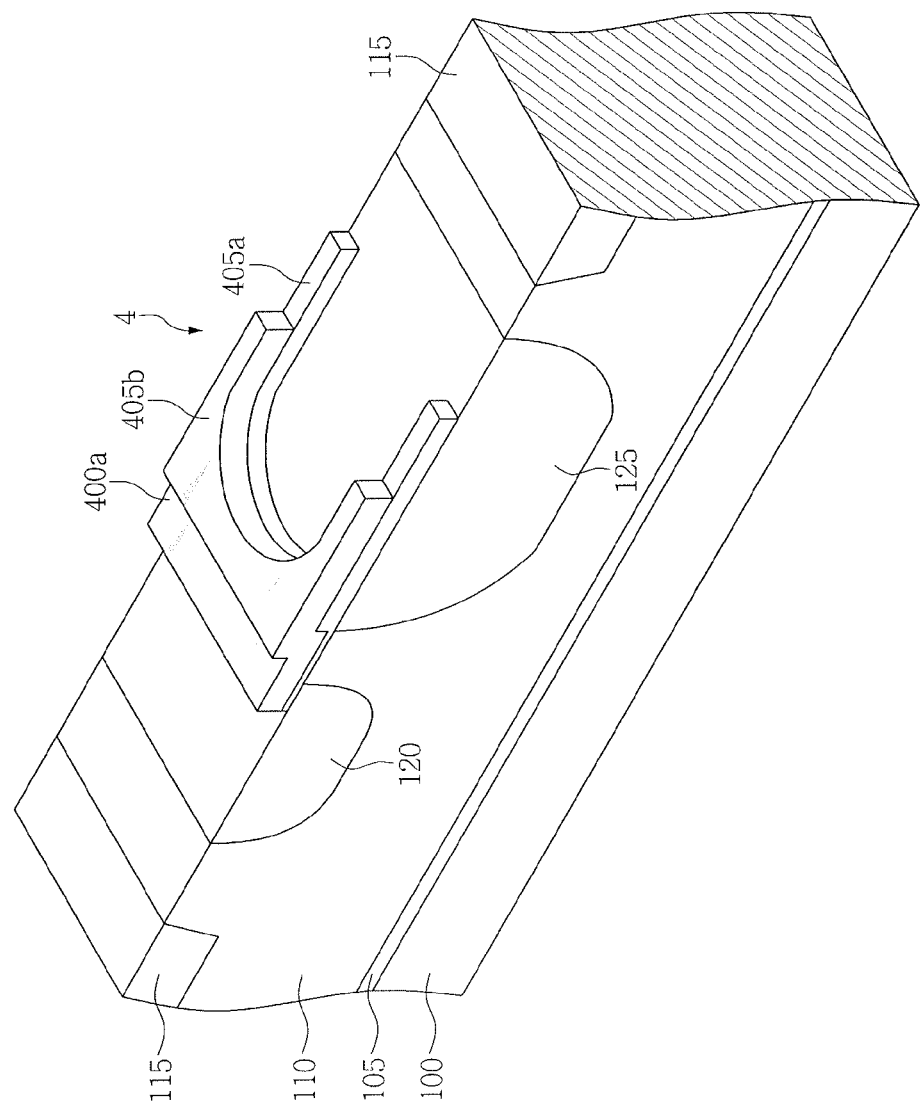
FIG. 26 illustrates a perspective view of a stage in a method of manufacturing the semiconductor device in FIG. 13.

FIG. 26 is a perspective view for describing a method of manufacturing the semiconductor device 4 in accordance with the embodiment. FIG. 26 is a perspective view showing the areas taken along the lines J-J' and L-L' shown in FIG. 13.

Referring to FIG. 26, the method of manufacturing the semiconductor device 4 in accordance with the embodiment may include forming the buried layer 105, the epitaxial layer 110, the isolation area 115, the body area 120 and the drift area 125 in the semiconductor substrate 100 in substantially the same manner as that described in FIG. 20, and forming the step gate area 410 on the semiconductor substrate 100.

Forming the step gate area 410 may include forming a gate dielectric material and a gate conductive material on the epitaxial layer 110 in which the body area 120 and the drift area 125 are formed, and forming the step gate dielectric layer 300 by etching the gate conductive material and the gate dielectric material.

The step gate area 410 may be formed so as to include the plate gate part 400 formed long in the direction y of the width W of the active area 117, and the finger gate part 405 having a shape of a plurality of bars.

The plate gate part 400 may be formed so as to include the plate gate dielectric layer part 400a and the plate gate conductive layer part 400b. The finger gate part 405 may be formed so as to include the finger gate dielectric layer part 405a and the finger gate conductive layer part 405b.

The finger gate part 405 is formed at a side part of the plate gate part 400, and thus, the gate area 410 may have an overall comb structure. The finger gate conductive layer part 405b is formed smaller than the finger gate dielectric layer part 405a, and thus, the finger gate dielectric layer part 405a may be exposed. The finger gate conductive layer part 405b of the finger gate part 405 may be formed of an undoped conductive material.

Then, the method may include forming the drain area 150, the body contact area 155, and the source area 160 around the step gate area 410 as shown in FIG. 16.

Figure 27:
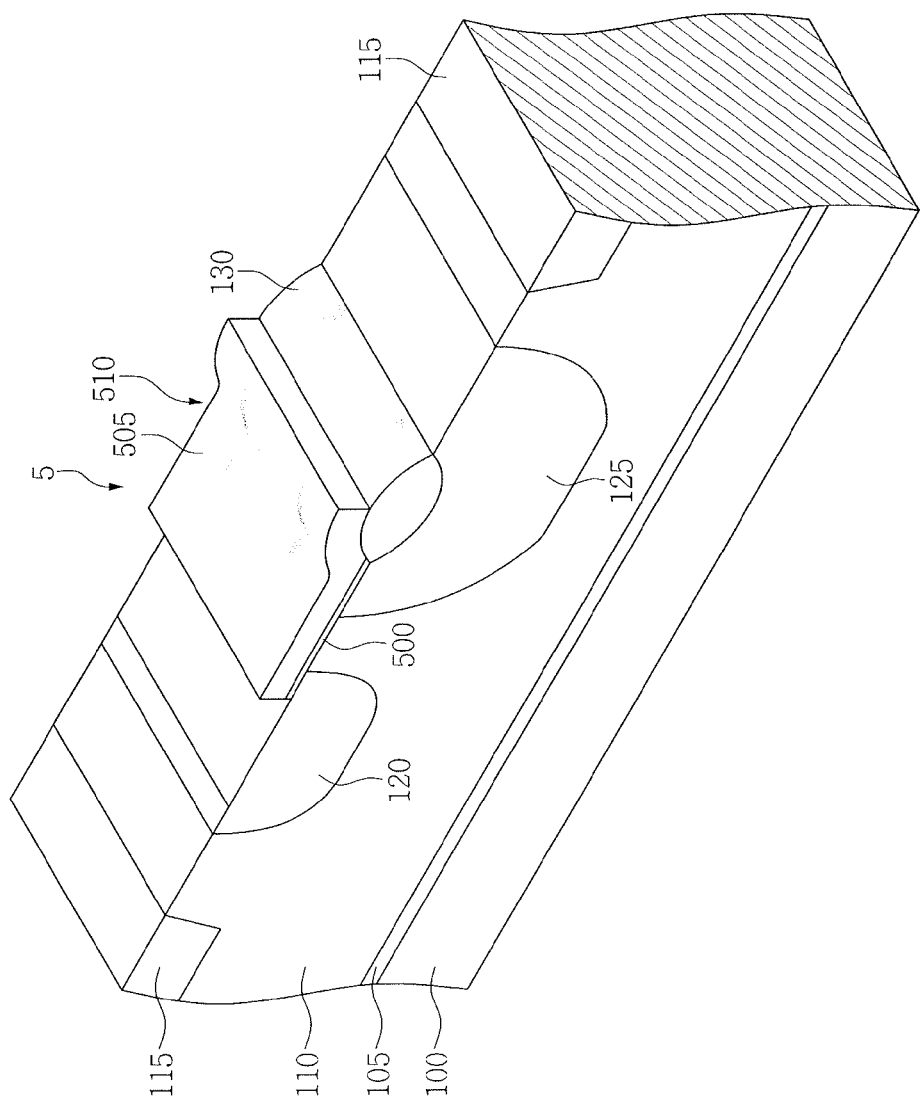
FIG. 27 illustrates a perspective view of a stage in a method of manufacturing the semiconductor device in FIG. 17.

FIG. 27 is a perspective view for describing a method of manufacturing the semiconductor device 5 in accordance with the embodiment. FIG. 27 is a perspective view showing the areas taken along the lines M-M' and N-N' shown in FIG. 17.

Referring to FIG. 27, the method of manufacturing the semiconductor device 5 in accordance with the embodiment may include forming the buried layer 105, the epitaxial layer 110, the isolation area 115, the body area 120, and the drift area 125 in the semiconductor substrate 100 in substantially the same manner as that described in FIG. 20, and forming the plate gate area 510 on the semiconductor substrate 100.

Forming the plate gate area 510 may include forming a gate dielectric material and a gate conductive material on the epitaxial layer 110 in which the body area 120 and the drift area 125 are formed, and forming the plate gate area 510 by etching the gate conductive material and the gate dielectric material.

The plate gate area 510 may include the gate dielectric layer 500, and the gate conductive layer 505. Forming the plate gate area 510 may include overlapping an area of an upper part of the LOCOS insulating layer 130 by crossing from the body area 120 to the drift area 125. An end part 515 of the gate conductive layer 505 may be formed so as to overlap the area of the upper part of the LOCOS insulating layer 130. The end part 515 of the gate conductive layer 505 which overlaps the LOCOS insulating layer 130 may be formed of an undoped conductive material.

Then, the method may include forming the drain area 150, the body contact area 155, and the source area 160 around the plate gate area 510 as shown in FIG. 19.

Figure 28:
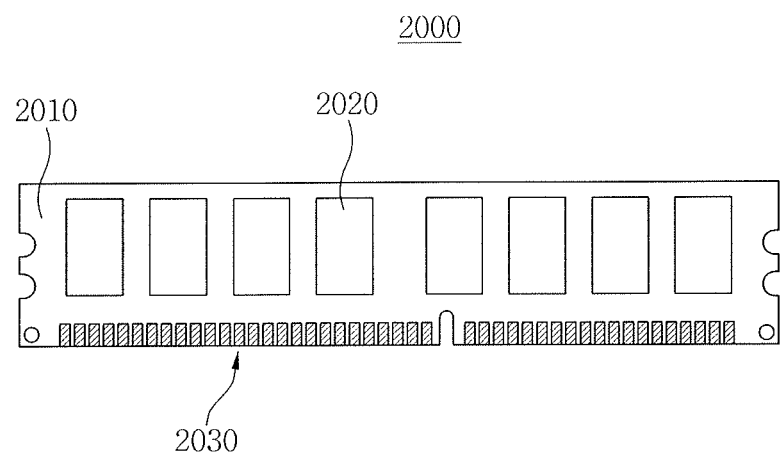
FIG. 28 illustrates a schematic view of a semiconductor module including a semiconductor device according to an embodiment.

FIG. 28 is a schematic view showing a semiconductor module 2000 including at least one of the semiconductor devices manufactured according to the embodiments.

Referring to FIG. 28, the semiconductor module 2000 may be a memory module including a memory device. The semiconductor module 2000 may include a module substrate 2010, and a plurality of semiconductor devices 2020 and a plurality of terminals 2030, which are disposed on the module substrate 2010. The terminals 2030 may include a conductive metal. The terminals 2030 may be electrically connected to the semiconductor devices 2020. The module substrate 2010 may be a memory module substrate. The module substrate 2010 may include a printed circuit board (PCB) or a wafer.

The semiconductor devices 2020 may be memory devices. The semiconductor devices 2020 may be, e.g., dynamic random access memory (DRAM) devices. The semiconductor devices 2020 may be the semiconductor device in accordance with the embodiment or a semiconductor package including the semiconductor device.

Figure 29:
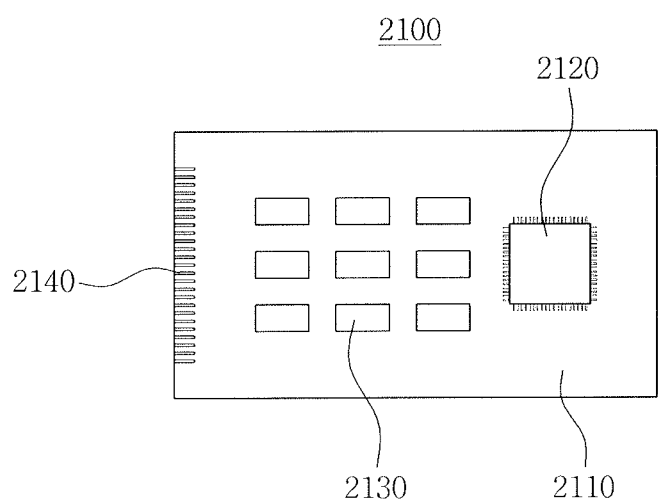
FIG. 29 illustrates a schematic view of a semiconductor module including a semiconductor device according to another embodiment.

FIG. 29 is a schematic view showing a semiconductor module 2100 including the semiconductor device manufactured according to another embodiment.

Referring to FIG. 29, the semiconductor module 2100 may include memory devices 2130 formed on a module substrate 2110. The memory device 2130 may be a memory device, e.g., a NAND flash memory, etc. The semiconductor module 2100 may include a semiconductor device 2120 mounted on the module substrate 2110. Input/output terminals 2140 may be disposed on at least one side of the module substrate 2110.

Figure 30:
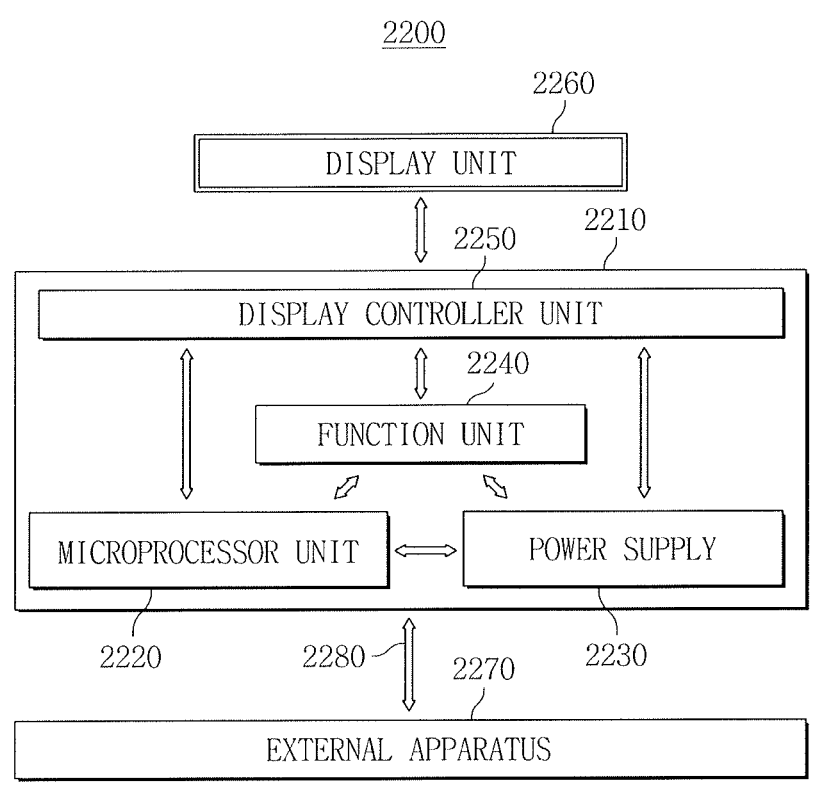
FIG. 30 illustrates a conceptual block diagram of an electronic system including a semiconductor device according to an embodiment.

FIG. 30 is a conceptual block diagram showing an electronic system 2200 including at least one semiconductor device manufactured according to the embodiment.

Referring to FIG. 30, the electronic system 2200 may include a body 2210. The body 2210 may include a microprocessor unit 2220, a power supply 2230, a function unit 2240, and/or a display controller unit 2250. The body 2210 may be a system board or a motherboard having a PCB, etc.

The microprocessor unit 2220, the power supply 2230, the function unit 2240, and the display controller unit 2250 may be installed or mounted on the body 2210. A display unit 2260 may be disposed on an upper surface of the body 2210 or outside the body 2210. For example, the display unit 2260 may be disposed on a surface of the body 2210, and then display an image processed by the display controller unit 2250. The power supply 2230 may receive a constant voltage from an external power supply, divide the voltage into various voltage levels, and supply those voltages to the microprocessor unit 2220, the function unit 2240, the display controller unit 2250, etc. The microprocessor unit 2220 may receive a voltage from the power supply 2230 to control the function unit 2240 and the display unit 2260.

The function unit 2240 may perform various functions of the electronic system 2200. For example, when the electronic system 2200 is a mobile electronic product, e.g., a cellular phone, etc., the function unit 2240 may include various components which perform wireless communication functions, e.g., dialing, image output to the display unit 2260, or voice output to a speaker through communication with an external apparatus 2270, and when a camera is included, the function unit 2240 may serve as an image processor.

In an embodiment, when the electronic system 2200 is connected to a memory card to expand the capacity the function unit 2240 may be a memory card controller. The function unit 2240 may exchange signals with the external apparatus 2270 through a wired or wireless communication unit 2280.

Further, when the electronic system 2200 requires a Universal Serial Bus (USB) to extend the functions, the function unit 2240 may serve as an interface controller.

Figure 31:
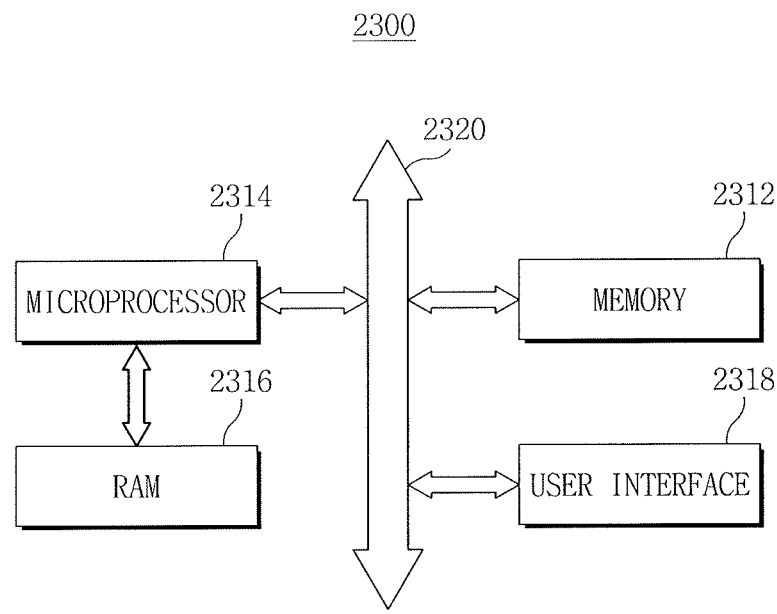
FIG. 31 illustrates a schematic block diagram of another electronic system including a semiconductor device according to an embodiment.

FIG. 31 is a schematic block diagram showing another electronic system 2300 including a semiconductor device manufactured according to the embodiment.

Referring to FIG. 31, the electronic system 2300 may include a semiconductor device in accordance with the embodiment. The electronic system 2300 may be used to manufacture a mobile device or a computer. For example, the electronic system 2300 may include a memory system 2312, a microprocessor 2314, a random access memory (RAM) 2316, and a user interface 2318 which performs data communication using a bus 2320. The microprocessor 2314 may program and control the electronic system 2300. The RAM 2316 may be used as an operational memory of the microprocessor 2314. The microprocessor 2314, the RAM 2316, and/or other components may be assembled within a single package. The memory system 2312 may be the semiconductor device in accordance with any one embodiment of the embodiments, or a semiconductor package including the semiconductor device.

The user interface 2318 may be used to input data to the electronic system 2300 or output data from the electronic system 2300. The memory system 2312 may store operational codes of the microprocessor 2314, data processed by the microprocessor 2314, or data received from the outside. The memory system 2312 may include a controller and a memory.

Figure 32:
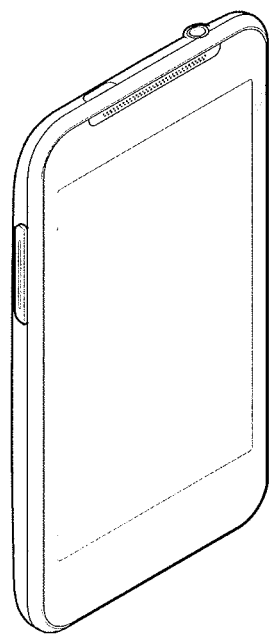
FIG. 32 illustrates a schematic view of a mobile wireless phone including a semiconductor device according to an embodiment.

FIG. 32 is a schematic view showing a mobile wireless phone 2400 including a semiconductor device manufactured according to the embodiment.

The mobile wireless phone 2400 may include a semiconductor device in accordance with the embodiment. The mobile wireless phone 2400 may be understood as a tablet PC. Furthermore, the semiconductor devices in accordance with the embodiments may be used in a portable computer, e.g., a notebook PC, an MPEG audio layer-3 (MP3) player, an MP4 player, a navigation device, a solid state disk (SSD), a desktop computer, an automobile, and a household appliance, in addition to the tablet PC.

According to embodiments, a LOCOS insulating layer is formed by recessing a part of a drift area formed in a semiconductor substrate. Then, a side part of a gate electrode is patterned in a finger shape on the LOCOS insulating layer, such that the finger-shaped gate electrode overlaps a reduced area of the LOCOS insulating layer. Accordingly, overlap capacitance in a gate area is reduced. Further, a phenomenon in which an electric field is concentrated in the drift area is reduced due to the LOCOS insulating layer, and thus, a breakdown voltage can be reduced. In addition, current flow between a drain area and a source area smoothly proceeds along a gentle slope of the LOCOS insulating layer, and thus, on-resistance can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a semiconductor substrate having a first conductivity type;
   an epitaxial layer having a second conductivity type on the semiconductor substrate;
   an isolation area in the epitaxial layer to define an active area of the semiconductor substrate;
   a body area having a first conductivity type and a drift area having a second conductivity type, the body area and the drift area being adjacent to each other in the epitaxial layer;
   a local oxidation of silicon (LOCOS) insulating layer in the drift area, side and lower surfaces of the LOCOS insulating layer being surrounded by the drift area;
   a drain area adjacent to a side part of the LOCOS insulating layer, side and lower surfaces of the drain area being surrounded by the drift area;
   a body contact area and a source area in the body area, side and lower surfaces of the body contact area and the source area being surrounded by the body area; and
   a gate area overlapping the drift area and a part of the LOCOS insulating layer from a direction of the body are,
   wherein the gate area includes a plurality of bar shaped portions extending from the direction of the body area, the bar shaped portions being spaced apart from each other, and a portion of the LOCOS insulating layer being exposed between the spaced bar shaped portions.

2. The device as claimed in claim 1, wherein the gate area includes:
- a plate gate part including a plate gate dielectric layer extending in a first direction of the active area and a plate gate conductive layer on the plate gate dielectric layer; and
- a finger gate part including a finger gate dielectric layer at a side surface of the plate gate part in a second direction perpendicular to the first direction of the active area, and a finger gate conductive layer on the finger gate dielectric layer,
- wherein the finger gate part includes first areas having stacked finger gate dielectric and conductive layers corresponding to the plurality of bar shaped portions, and second area not having the stacked finger gate dielectric and conductive layers, the first and second areas being alternately disposed.

3. The device as claimed in claim 2, wherein the finger gate part includes bar-shaped unit finger gate parts extending in the second direction of the active area.

4. The device as claimed in claim 3, wherein the LOCOS insulating layer has an independent island structure only under the unit finger gate part to overlap the unit finger gate part.

5. The device as claimed in claim 2, wherein the finger gate conductive layer includes a conductive material having conductivity lower than the plate gate conductive layer.

6. The device as claimed in claim 2, wherein the finger gate conductive layer includes an undoped conductive material.

7. The device as claimed in claim 2, wherein the LOCOS insulating layer includes a LOCOS insulating layer in one body extending longer in the first direction of the active area than in the second direction of the active area.

8. The device as claimed in claim 2, wherein the finger gate part overlaps the LOCOS insulating layer.

9. The device as claimed in claim 1, wherein the gate area includes:
- a gate dielectric layer part overlapping the drift area and a part of the LOCOS insulating layer from the direction of the body area; and
- a conductive layer part on the gate dielectric layer part.

10. The device as claimed in claim 9, wherein a part of the conductive layer part, which overlaps the LOCOS insulating layer, includes an undoped conductive material.

11. The device as claimed in claim 1, wherein an entire space extending between two adjacent bar shaped portions exposes a portion of the LOCOS insulating layer.

12. The device as claimed in claim 1, wherein a portion of an upper surface of the drift area at least between the body area and the LOCOS insulating layer is exposed.

13. The device as claimed in claim 1, wherein the gate area includes a plate portion,
- wherein a portion of the plate portion overlaps the body area,
- wherein the bar shaped portions extend from the plate portion and partially overlap the drift area and the LOCOS insulating layer, and
- wherein end portions of the bar shaped portions overlap the LOCOS insulating layer.

14. A semiconductor device, comprising:
- a semiconductor substrate having a first conductivity type;
- an epitaxial layer having a second conductivity type on the semiconductor substrate;
- an isolation area in the epitaxial layer to define an active area of the semiconductor substrate;
- a body area having a first conductivity type and a drift area having a second conductivity type, the body area and the drift area being adjacent to each other in the epitaxial layer;
- a local oxidation of silicon (LOCOS) insulating layer in the drift area, side and lower surfaces of the LOCOS insulating layer being surrounded by the drift area;
- a drain area adjacent to the LOCOS insulating layer, side and lower surfaces of the drain area being surrounded by the drift area;
- a body contact area and a source area in the body area, side and lower surfaces of the body contact area and the source area being surrounded by the body area; and
- a gate area on the epitaxial layer, the gate area only partially overlapping each of the drift area and the LOCOS insulating layer,
- wherein a portion of an upper surface of the drift area at least between the body area and the LOCOS insulating layer is exposed.

15. The device as claimed in claim 14, wherein a portion of an upper surface of the LOCOS insulating layer is exposed.

16. The device as claimed in claim 14, wherein the gate area includes a plurality of bar shaped portions on the epitaxial layer, the bar shaped portions extending in a first direction and being spaced apart from each other along a second direction perpendicular to the first direction to only partially overlap the drift area and the LOCOS insulating layer.

17. The device as claimed in claim 16, wherein only end portions of the bar shaped portions overlap the LOCOS insulating layer.

* * * * *